(12) United States Patent
Ooishi

(10) Patent No.: US 6,879,513 B2
(45) Date of Patent: Apr. 12, 2005

(54) CURRENT DRIVE CIRCUIT AVOIDING EFFECT OF VOLTAGE DROP CAUSED BY LOAD AND SEMICONDUCTOR MEMORY DEVICE EQUIPPED THEREWITH

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 58 days.

(21) Appl. No.: 10/396,414

(22) Filed: Mar. 26, 2003

(65) Prior Publication Data

US 2004/0057280 A1 Mar. 25, 2004

(30) Foreign Application Priority Data

Sep. 19, 2002 (JP) ........................................ 2002-273620

(51) Int. Cl.[7] .............................................. G11C 11/00
(52) U.S. Cl. ........................ 365/158; 365/203; 365/229; 365/230.06
(58) Field of Search .................................. 365/158, 203, 365/229, 230.06

(56) References Cited

U.S. PATENT DOCUMENTS 6,088,286 A * 7/2000 Yamauchi et al. ...... 365/230.06
6,256,224 B1 7/2001 Perner et al.
2003/0123281 A1 * 7/2003 Iwata et al. .................. 365/158
2003/0174536 A1 * 9/2003 Hidaka ........................ 365/158

FOREIGN PATENT DOCUMENTS

JP          05-347550 A          12/1993

* cited by examiner

*Primary Examiner*—Hoai Ho
(74) *Attorney, Agent, or Firm*—Burns, Doane, Swecker & Mathis, L.L.P.

(57) ABSTRACT

A current drive circuit operates receiving higher voltage than in a waiting mode at source terminal of a P-channel first driver transistor, when supplying a current to a node connected to a load circuit. In accordance with the rising source potential of the first driver transistor, the gate potential output to the first driver transistor by a gate potential control circuit rises. When the first and second driver transistors are off, a precharge circuit configured with a P-channel MOS transistor precharges the node to a prescribed potential. As a result, the current drive circuit is provided with increased reliability of the gate insulating films of the driver transistors without decreasing the driving current.

16 Claims, 26 Drawing Sheets

| P1 | OFF | P2 | ON |
|---|---|---|---|
| N1 | OFF | load6 | OFF |

| G1 | POWER SUPPLY SIDE | 1.2V |
|---|---|---|
| | GND SIDE | 0V |
| G2 | POWER SUPPLY SIDE | 1.2V |
| | GND SIDE | 0V |
| Vg(P1) | | 1.2V |
| Vg(N1) | | 0V |
| Vcc | | 1.2V |
| Vpre | | 1.2V |
| $V_{ND1}$ | | 1.2V |

FIG.4

| P1 | OFF | P2    | ON  |
|----|-----|-------|-----|
| N1 | OFF | load6 | OFF |

FIG.5

| G1 | POWER SUPPLY SIDE | 2.5V |
|    | GND SIDE          | 1.2V |
| G2 | POWER SUPPLY SIDE | 1.2V |
|    | GND SIDE          | 0V   |
| Vg(P1) | | 2.5V |
| Vg(N1) | | 0V |
| Vcc | | 2.5V |
| Vpre | | 1.2V |
| $V_{ND1}$ | | 1.2V |

FIG.6

| P1 | ON  | P2    | OFF |
|----|-----|-------|-----|
| N1 | OFF | load6 | ON  |

FIG.7

| G1 | POWER SUPPLY SIDE | 2.5V |
|    | GND SIDE          | 1.2V |
| G2 | POWER SUPPLY SIDE | 1.2V |
|    | GND SIDE          | 0V   |
| Vg(P1) | | 1.2V |
| Vg(N1) | | 0V |
| Vcc | | 2.5V |
| Vpre | | 1.2V |
| $V_{ND1}$ | | 1.0~1.5V |

| P11 | OFF | P12 | OFF |
|-----|-----|-----|-----|
| N11 | OFF | N12 | OFF |
| P3  | ON  |     |     |

| G11 | POWER SUPPLY SIDE | 1.2V | G12 | POWER SUPPLY SIDE | 1.2V |
|-----|-------------------|------|-----|-------------------|------|
|     | GND SIDE          | 0V   |     | GND SIDE          | 0V   |
| G21 | POWER SUPPLY SIDE | 1.2V | G22 | POWER SUPPLY SIDE | 1.2V |
|     | GND SIDE          | 0V   |     | GND SIDE          | 0V   |
| $V_g(P11)$ | | 1.2V | $V_g(P12)$ | | 1.2V |
| $V_g(N11)$ | | 0V   | $V_g(N12)$ | | 0V   |
| V1 | | 1.2V | | | |
| V2 | | 0.6V | | | |
| $V_{BL}$ | | 0.6V | | | |

FIG.17

| P11 | OFF | P12 | OFF |
|-----|-----|-----|-----|
| N11 | OFF | N12 | OFF |
| P3  | ON  |     |     |

FIG.18

| G11 | POWER SUPPLY SIDE | 2.5V | G12 | POWER SUPPLY SIDE | 2.5V |
|-----|-------------------|------|-----|-------------------|------|
|     | GND SIDE          | 1.2V |     | GND SIDE          | 1.2V |
| G21 | POWER SUPPLY SIDE | 1.2V | G22 | POWER SUPPLY SIDE | 1.2V |
|     | GND SIDE          | 0V   |     | GND SIDE          | 0V   |
| Vg(P11) | | 2.5V | Vg(P12) | | 2.5V |
| Vg(N11) | | 0V   | Vg(N12) | | 0V   |
| V1  | | 2.5V | | | |
| V2  | | 1.2V | | | |
| $V_{BL}$ | | 1.2V | | | |

FIG.19

| P11 | ON  | P12 | OFF |
|-----|-----|-----|-----|
| N11 | OFF | N12 | ON  |
| P3  | OFF |     |     |

FIG.20

| G11 | POWER SUPPLY SIDE | 2.5V | G12 | POWER SUPPLY SIDE | 2.5V |
|-----|-------------------|------|-----|-------------------|------|
|     | GND SIDE          | 1.2V |     | GND SIDE          | 1.2V |
| G21 | POWER SUPPLY SIDE | 1.2V | G22 | POWER SUPPLY SIDE | 1.2V |
|     | GND SIDE          | 0V   |     | GND SIDE          | 0V   |
| Vg(P11) | | 1.2V | Vg(P12) | | 2.5V |
| Vg(N11) | | 0V   | Vg(N12) | | 1.2V |
| V1  | | 2.5V | | | |
| V2  | | 1.2V | | | |
| $V_{BL}$ | | 1.0~1.5V | | | |

| N2 | OFF | P2 | ON |
|---|---|---|---|
| N1 | OFF | load6 | OFF |

| G3 | POWER SUPPLY SIDE | 1.2V |
|---|---|---|
| | GND SIDE | 0V |
| G2 | POWER SUPPLY SIDE | 1.2V |
| | GND SIDE | 0V |
| Vg(N2) | | 0V |
| Vg(N1) | | 0V |
| Vcc | | 1.2V |
| Vpre | | 1.2V |
| V$_{ND1}$ | | 1.2V |

FIG.25

| N2 | OFF | P2 | ON |
|---|---|---|---|
| N1 | OFF | load6 | OFF |

FIG.26

| G3 | POWER SUPPLY SIDE | 3.0V |
|---|---|---|
|    | GND SIDE | 1.2V |
| G2 | POWER SUPPLY SIDE | 1.2V |
|    | GND SIDE | 0V |
| | Vg(N2) | 1.2V |
| | Vg(N1) | 0V |
| | Vcc | 2.5V |
| | Vpre | 1.2V |
| | $V_{ND1}$ | 1.2V |

FIG.27

| N2 | ON | P2 | OFF |
|---|---|---|---|
| N1 | OFF | load6 | ON |

FIG.28

| G3 | POWER SUPPLY SIDE | 3.0V |
|---|---|---|
|    | GND SIDE | 1.2V |
| G2 | POWER SUPPLY SIDE | 1.2V |
|    | GND SIDE | 0V |
| | Vg(N2) | 3.0V |
| | Vg(N1) | 0V |
| | Vcc | 2.5V |
| | Vpre | 1.2V |
| | $V_{ND1}$ | 1.0~1.5V |

| P13 | OFF | N14 | OFF |
|---|---|---|---|
| N11 | OFF | N12 | OFF |
| P3 | ON | | |

| G13 | POWER SUPPLY SIDE | 1.2V | G14 | POWER SUPPLY SIDE | 1.2V |
|---|---|---|---|---|---|
| | GND SIDE | 0V | | GND SIDE | 0V |
| G21 | POWER SUPPLY SIDE | 1.2V | G22 | POWER SUPPLY SIDE | 1.2V |
| | GND SIDE | 0V | | GND SIDE | 0V |
| Vg(N13) | | 0V | Vg(N14) | | 0V |
| Vg(N11) | | 0V | Vg(N12) | | 0V |
| V1 | | 1.2V | | | |
| V2 | | 0.6V | | | |
| $V_{BL}$ | | 0.6V | | | |

FIG.33

| N13 | OFF | N14 | OFF |
|---|---|---|---|
| N11 | OFF | N12 | OFF |
| P3 | ON | | |

FIG.34

| G13 | POWER SUPPLY SIDE | 3.0V | G14 | POWER SUPPLY SIDE | 3.0V |
|---|---|---|---|---|---|
| | GND SIDE | 1.2V | | GND SIDE | 1.2V |
| G21 | POWER SUPPLY SIDE | 1.2V | G22 | POWER SUPPLY SIDE | 1.2V |
| | GND SIDE | 0V | | GND SIDE | 0V |
| | Vg(N13) | 1.2V | | Vg(N14) | 1.2V |
| | Vg(N11) | 0V | | Vg(N12) | 0V |
| | V1 | 2.5V | | | |
| | V2 | 1.2V | | | |
| | $V_{BL}$ | 1.2V | | | |

FIG.35

| N13 | ON | N14 | OFF |
|---|---|---|---|
| N11 | OFF | N12 | ON |
| P3 | OFF | | |

FIG.36

| G13 | POWER SUPPLY SIDE | 3.0V | G14 | POWER SUPPLY SIDE | 3.0V |
|---|---|---|---|---|---|
| | GND SIDE | 1.2V | | GND SIDE | 1.2V |
| G21 | POWER SUPPLY SIDE | 1.2V | G22 | POWER SUPPLY SIDE | 1.2V |
| | GND SIDE | 0V | | GND SIDE | 0V |
| | Vg(N13) | 3.0V | | Vg(N14) | 1.2V |
| | Vg(N11) | 0V | | Vg(N12) | 1.2V |
| | V1 | 2.5V | | | |
| | V2 | 1.2V | | | |
| | $V_{BL}$ | 1.0~1.5V | | | |

FIG.44

| P11 | OFF | P12 | OFF |
|---|---|---|---|
| N11 | OFF | N12 | OFF |
| P21 | OFF | P22 | OFF |
| N21 | OFF | N22 | OFF |
| P31 | OFF | P32 | OFF |
| N31 | OFF | N32 | OFF |
| P3 | ON | | |
| P4 | ON | | |

FIG.45

| G11 | POWER SUPPLY SIDE | 1.2V | G12 | POWER SUPPLY SIDE | 1.2V |
|---|---|---|---|---|---|
| | GND SIDE | 0V | | GND SIDE | 0V |
| G21 | POWER SUPPLY SIDE | 1.2V | G22 | POWER SUPPLY SIDE | 1.2V |
| | GND SIDE | 0V | | GND SIDE | 0V |
| G31 | POWER SUPPLY SIDE | 1.2V | G32 | POWER SUPPLY SIDE | 1.2V |
| | GND SIDE | 0V | | GND SIDE | 0V |
| G41 | POWER SUPPLY SIDE | 1.2V | G42 | POWER SUPPLY SIDE | 1.2V |
| | GND SIDE | 0V | | GND SIDE | 0V |
| G51 | POWER SUPPLY SIDE | 1.2V | G52 | POWER SUPPLY SIDE | 1.2V |
| | GND SIDE | 0V | | GND SIDE | 0V |
| G61 | POWER SUPPLY SIDE | 1.2V | G62 | POWER SUPPLY SIDE | 1.2V |
| | GND SIDE | 0V | | GND SIDE | 0V |
| Vg(P11) | | 1.2V | Vg(P12) | | 1.2V |
| Vg(N11) | | 0V | Vg(N12) | | 0V |
| Vg(P21) | | 1.2V | Vg(P22) | | 1.2V |
| Vg(N21) | | 0V | Vg(N22) | | 0V |
| Vg(P31) | | 1.2V | Vg(P32) | | 1.2V |
| Vg(N31) | | 0V | Vg(N32) | | 0V |
| V1 | | 1.2V | | | |
| V2 | | 0.6V | | | |
| $V_{BLa,BLb}$ | | 0.6V | | | |
| $V_{BLc,BLd}$ | | 0.6V | | | |

FIG.46

| P11 | OFF | P12 | OFF |
|---|---|---|---|
| N11 | OFF | N12 | OFF |
| P21 | OFF | P22 | OFF |
| N21 | OFF | N22 | OFF |
| P31 | OFF | P32 | OFF |
| N31 | OFF | N32 | OFF |
| P3 | ON | | |
| P4 | ON | | |

FIG.47

| | | | | | |
|---|---|---|---|---|---|
| G11 | POWER SUPPLY SIDE | 2.5V | G12 | POWER SUPPLY SIDE | 2.5V |
| | GND SIDE | 1.2V | | GND SIDE | 1.2V |
| G21 | POWER SUPPLY SIDE | 1.2V | G22 | POWER SUPPLY SIDE | 1.2V |
| | GND SIDE | 0V | | GND SIDE | 0V |
| G31 | POWER SUPPLY SIDE | 2.5V | G32 | POWER SUPPLY SIDE | 2.5V |
| | GND SIDE | 1.2V | | GND SIDE | 1.2V |
| G41 | POWER SUPPLY SIDE | 1.2V | G42 | POWER SUPPLY SIDE | 1.2V |
| | GND SIDE | 0V | | GND SIDE | 0V |
| G51 | POWER SUPPLY SIDE | 2.5V | G52 | POWER SUPPLY SIDE | 2.5V |
| | GND SIDE | 1.2V | | GND SIDE | 1.2V |
| G61 | POWER SUPPLY SIDE | 1.2V | G62 | POWER SUPPLY SIDE | 1.2V |
| | GND SIDE | 0V | | GND SIDE | 0V |
| Vg(P11) | 2.5V | | Vg(P12) | | 2.5V |
| Vg(N11) | 0V | | Vg(N12) | | 0V |
| Vg(P21) | 2.5V | | Vg(P22) | | 2.5V |
| Vg(N21) | 0V | | Vg(N22) | | 0V |
| Vg(P31) | 2.5V | | Vg(P32) | | 2.5V |
| Vg(N31) | 0V | | Vg(N32) | | 0V |
| V1 | 2.5V | | | | |
| V2 | 1.2V | | | | |
| $V_{BLa, BLb}$ | 1.2V | | | | |
| $V_{BLc, BLd}$ | 1.2V | | | | |

FIG.48

| P11 | ON  | P12 | OFF |
|-----|-----|-----|-----|
| N11 | OFF | N12 | ON  |
| P21 | OFF | P22 | OFF |
| N21 | ON  | N22 | OFF |
| P31 | OFF | P32 | OFF |
| N31 | OFF | N32 | OFF |
| P3  | OFF |     |     |
| P4  | ON  |     |     |

FIG.49

| G11 | POWER SUPPLY SIDE | 2.5V | G12 | POWER SUPPLY SIDE | 2.5V |
|-----|---|---|---|---|---|
|     | GND SIDE | 1.2V |     | GND SIDE | 1.2V |
| G21 | POWER SUPPLY SIDE | 1.2V | G22 | POWER SUPPLY SIDE | 1.2V |
|     | GND SIDE | 0V |     | GND SIDE | 0V |
| G31 | POWER SUPPLY SIDE | 2.5V | G32 | POWER SUPPLY SIDE | 2.5V |
|     | GND SIDE | 1.2V |     | GND SIDE | 1.2V |
| G41 | POWER SUPPLY SIDE | 1.2V | G42 | POWER SUPPLY SIDE | 1.2V |
|     | GND SIDE | 0V |     | GND SIDE | 0V |
| G51 | POWER SUPPLY SIDE | 2.5V | G52 | POWER SUPPLY SIDE | 2.5V |
|     | GND SIDE | 1.2V |     | GND SIDE | 1.2V |
| G61 | POWER SUPPLY SIDE | 1.2V | G62 | POWER SUPPLY SIDE | 1.2V |
|     | GND SIDE | 0V |     | GND SIDE | 0V |
| Vg(P11) | | 1.2V | Vg(P12) | | 2.5V |
| Vg(N11) | | 0V | Vg(N12) | | 1.2V |
| Vg(P21) | | 2.5V | Vg(P22) | | 2.5V |
| Vg(N21) | | 1.2V | Vg(N22) | | 0V |
| Vg(P31) | | 2.5V | Vg(P32) | | 2.5V |
| Vg(N31) | | 0V | Vg(N32) | | 0V |
| V1 | | 2.5V | | | |
| V2 | | 1.2V | | | |
| $V_{BLa}$ | | 0.7~1.2V | | | |
| $V_{BLc, BLd}$ | | 1.2V | | | |

FIG.50

| P11 | ON | P12 | ON |
|---|---|---|---|
| N11 | OFF | N12 | OFF |
| P21 | OFF | P22 | OFF |
| N21 | ON | N22 | OFF |
| P31 | OFF | P32 | OFF |
| N31 | OFF | N32 | OFF |
| P3 | OFF | | |
| P4 | ON | | |

FIG.51

| | | | | | |
|---|---|---|---|---|---|
| G11 | POWER SUPPLY SIDE | 2.5V | G12 | POWER SUPPLY SIDE | 2.5V |
| | GND SIDE | 1.2V | | GND SIDE | 1.2V |
| G21 | POWER SUPPLY SIDE | 1.2V | G22 | POWER SUPPLY SIDE | 1.2V |
| | GND SIDE | 0V | | GND SIDE | 0V |
| G31 | POWER SUPPLY SIDE | 2.5V | G32 | POWER SUPPLY SIDE | 2.5V |
| | GND SIDE | 1.2V | | GND SIDE | 1.2V |
| G41 | POWER SUPPLY SIDE | 1.2V | G42 | POWER SUPPLY SIDE | 1.2V |
| | GND SIDE | 0V | | GND SIDE | 0V |
| G51 | POWER SUPPLY SIDE | 2.5V | G52 | POWER SUPPLY SIDE | 2.5V |
| | GND SIDE | 1.2V | | GND SIDE | 1.2V |
| G61 | POWER SUPPLY SIDE | 1.2V | G62 | POWER SUPPLY SIDE | 1.2V |
| | GND SIDE | 0V | | GND SIDE | 0V |
| Vg(P11) | | 1.2V | Vg(P12) | | 1.2V |
| Vg(N11) | | 0V | Vg(N12) | | 0V |
| Vg(P21) | | 2.5V | Vg(P22) | | 2.5V |
| Vg(N21) | | 1.2V | Vg(N22) | | 0V |
| Vg(P31) | | 2.5V | Vg(P32) | | 2.5V |
| Vg(N31) | | 0V | Vg(N32) | | 0V |
| V1 | | 2.5V | | | |
| V2 | | 1.2V | | | |
| $V_{BLb}$ | | 1.0～1.5V | | | |
| $V_{BLc, BLd}$ | | 1.2V | | | |

CURRENT DRIVE CIRCUIT AVOIDING EFFECT OF VOLTAGE DROP CAUSED BY LOAD AND SEMICONDUCTOR MEMORY DEVICE EQUIPPED THEREWITH

BACKGROUND OF THE INVENTION

1. Field of the Invention

The present invention relates to a current drive circuit and a semiconductor memory device, and specifically, to a current drive circuit configured with a tristate buffer and a semiconductor memory device equipped with that current drive circuit.

2. Description of the Background Art

Recently, an MRAM (Magnetic Random Access Memory) device has been receiving attention as a non-volatile memory device of low power consumption. The MRAM device is a memory device that stores data in a non-volatile manner using a plurality of magnetic thin films formed in a semiconductor circuit, and enables a random access for each of magnetic thin films.

Additionally, an OUM (Ovonic Unified Memory) device has been receiving attention as well, as a non-volatile memory device of low power consumption, and capable of easy integration with a conventional CMOS process technique. The OUM device is a memory device that uses a material referred to as chalcogenide, which changes phases in accordance with resistance heating, for memory cells to store data in non-volatile manner.

In these MRAM device and OUM device, in data writing mode, a current drive circuit that operates supplied with a prescribed supply voltage causes a current to flow through a select bit line, with a non-select bit line in a floating state. By the prescribed amount of current flowing through the select bit line, the magnetization direction of a ferromagnetic layer referred to as a free magnetization layer changes in a memory cell of MRAM, while a phase change region referred to as a chalcogenide layer changes the phase in a memory cell of OUM device. Utilizing the phenomenon that the resistance value changes in accordance with the change of the internal state, data are stored in memory cells in non-volatile manner.

In a conventional current drive circuit for MRAM and OUM devices, attempts has been made to attain higher speed and lower power consumption, which includes inserting, between a write driver and a power supply node, means for controlling current supply for providing either a large or a small current, thereby switching the amount of the current as appropriate to supply to the write driver (Japanese Patent Laying-Open No. 5-347550).

On the other hand, when the conventional current drive circuit above causes a current to flow through a load (corresponding mainly to a discharging transistor of the current drive circuit in MRAM device, and corresponding mainly to a memory cell itself in OUM device), the drain potential of a driver transistor changes due to the voltage drop resulted from load resistance. Specifically, the voltage drop resulted from load resistance effects to reduce the source-drain voltage of the driver transistor. Therefore, in the conventional current drive circuit above, the driving current supplying to the load undesirably decreases depending on the load resistance.

In order to address the situation, the thickness of the gate insulating film of the driver transistor may be made thinner to increase the current drivability. In the conventional current drive circuit, however, the voltage difference of supply voltage level (2.5V) is applied to any one of source-drain, source-gate and gate-drain of the driver transistor, and hence the gate insulating film must be thick film that has breakdown resistance tolerable to that voltage difference. Therefore, the drivability of the current drive circuit can not be increased.

Further, since a voltage of power source voltage level is applied to source-drain of the driver transistor when a current is not caused to flow by the current drive circuit, a leakage current is resulted in the driver transistor. Specifically, as in MRAM device, when a current drive circuit is provided at each opposing sides of every bit line, the total amount of the leakage current is not negligible from the viewpoint of power consumption.

SUMMARY OF THE INVENTION

Therefore, the present invention is to solve the problems above, and an object of the present invention is to provide a current drive circuit in which reliability of a gate insulating film of a driver transistor is improved without decreasing drive current.

Another object of the present invention is to provide a semiconductor memory device equipped with a current drive circuit in which reliability of a gate insulating film of a driver transistor is improved without decreasing drive current.

Still another object of the present invention is to provide a current drive circuit with reduced power consumption in waiting mode.

Still another object of the present invention is to provide a semiconductor device equipped with a current drive circuit with reduced power consumption in waiting mode.

According to the present invention, a current drive circuit passing a current through a load circuit with resistance includes a node connected to the load circuit, and a driver receiving a first voltage and a second voltage; wherein a voltage difference between the second voltage and a voltage on the node is larger than the first voltage; and the driver passes a current through the node in accordance with the voltage difference.

According to the present invention, a semiconductor device includes a plurality of memory cells arranged in rows and columns, a plurality of bit lines provided corresponding to each column of memory cells, and a plurality of current drive circuits provided corresponding to the plurality of bit lines to pass a current through corresponding bit line. Each of the plurality of current drive circuits receives a first voltage and a second voltage. A voltage difference between the second voltage and a voltage on the corresponding bit line is larger than the first voltage, and each of the plurality of current drive circuits passes a current through the corresponding bit line in accordance with the voltage difference.

Therefore, with the current drive circuit according to the present invention, since the voltage supplied to the driver transistor is changed in accordance with the operating conditions, the reduction of the current drivability resulted from the resistance of the load circuit can be prevented.

Further, with the semiconductor memory device according to the present invention, since the voltage supplied to the current drive circuit passing current to a bit line is changed in accordance with the operating conditions, the reduction of the current drivability of the current drive circuit resulted from the load resistance of the discharging circuit can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows an operating condition of the current drive circuit according to the first embodiment in standby mode;

FIG. 5 shows voltage distribution of the current drive circuit according to the first embodiment in standby mode;

FIG. 6 shows an operating condition of the current drive circuit according to the first embodiment in select mode;

FIG. 7 shows voltage distribution of the current drive circuit according to the first embodiment in select mode;

FIG. 17 shows an operating condition of the current drive circuit shown in FIG. 14 in standby mode;

FIG. 18 shows voltage distribution of the current drive circuit shown in FIG. 14 in standby mode;

FIG. 19 shows an operating condition of the current drive circuit shown in FIG. 14 in select mode;

FIG. 20 shows voltage distribution of the current drive circuit shown in FIG. 14 in select mode;

FIG. 25 shows an operating condition of the current drive circuit according to the third embodiment in standby mode;

FIG. 26 shows voltage distribution of the current drive circuit according to the third embodiment in standby mode;

FIG. 27 shows an operating condition of the current drive circuit according to the third embodiment in select mode;

FIG. 28 shows voltage distribution of the current drive circuit according to the third embodiment in select mode;

FIG. 33 shows an operating condition of the current drive circuit shown in FIG. 30 in standby mode;

FIG. 34 shows voltage distribution of the current drive circuit shown in FIG. 30 in standby mode;

FIG. 35 shows an operating condition of the current drive circuit shown in FIG. 30 in select mode;

FIG. 36 shows voltage distribution of the current drive circuit shown in FIG. 30 in select mode;

FIG. 44 shows an operating condition of the current drive circuit shown in FIG. 43 in waiting mode;

FIG. 45 shows voltage distribution of the current drive circuit shown in FIG. 43 in waiting mode;

FIG. 46 shows an operating condition of the current drive circuit shown in FIG. 43 in standby mode;

FIG. 47 shows voltage distribution of the current drive circuit shown in FIG. 43 in standby mode;

FIG. 48 shows a first operating condition of the current drive circuit shown in FIG. 43 in select mode;

FIG. 49 shows the voltage distribution in the first operating condition of the current drive circuit shown in FIG. 43;

FIG. 50 shows a second operating condition of the current drive circuit shown in FIG. 43 in select mode;

FIG. 51 shows voltage distribution of the current drive circuit shown in FIG. 43 in the second operating condition.

DESCRIPTION OF THE PREFERRED EMBODIMENTS

Figures 1, 2, 3:
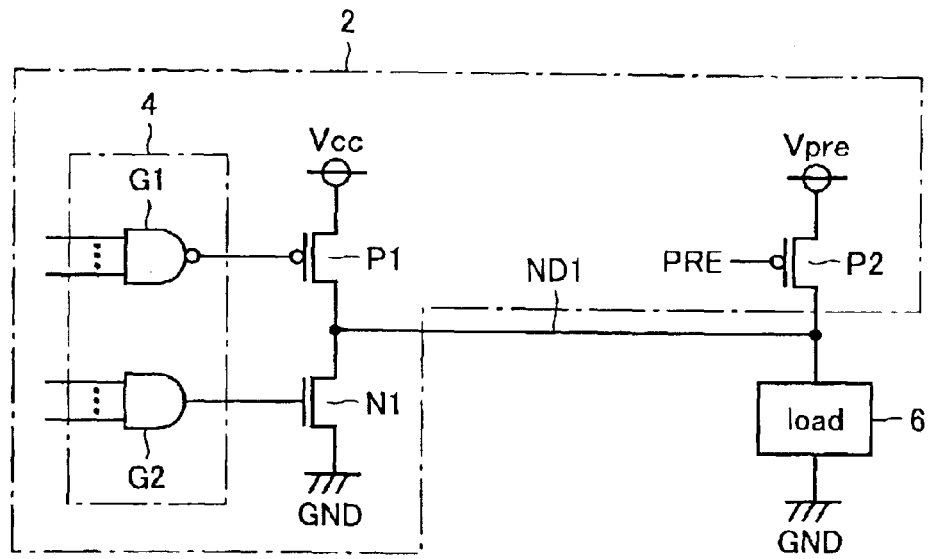
FIG. 1 is a circuit diagram showing the configuration of a current drive circuit according to a first embodiment.
FIG. 2 shows an operating condition of the current drive circuit according to the first embodiment in waiting mode.
FIG. 3 shows voltage distribution of the current drive circuit according to the first embodiment in waiting mode.

In the following, referring to the figures, the preferred embodiments of the present invention will be described in detail. In the figures, identical or similar parts are given an identical reference character and the description thereof will not be repeated.

First Embodiment

FIG. 1 is a circuit diagram showing the configuration of a current drive circuit according to a first embodiment of the present invention. Referring to FIG. 1, current drive circuit 2 includes P-channel MOS transistors P1, P2, an N-channel MOS transistor N1, a gate potential control circuit 4, power supply nodes Vcc, Vpre, and a ground node GND. Gate potential control circuit 4 includes an NAND gate G1 and an AND gate G2.

P-channel MOS transistor P1 and N-channel MOS transistor N1 (hereinafter also referred to as "driver transistor") are configured with gate insulating films thinner than a gate insulating film of a driver transistor in a conventional current drive circuit. P-channel MOS transistor P1 is connected between node ND1 connected to a load circuit 6 and power supply node Vcc, and receives an output signal from NAND gate G1 at its gate. N-channel MOS transistor N1 is connected between node ND1 and ground node GND, and receives an output signal from AND gate G2 at its gate. NAND gate G1 operates logical multiplication of at least one drive condition signal, and outputs a signal inverting the operation result. AND gate G2 outputs a signal resulted from the operation of logical multiplication of the at least one drive condition signal above. P-channel MOS transistor P2 is connected between supply node Vpre and node ND1, and receives a precharge signal PRE at its gate.

Load circuit 6 connected to node ND1 generally represents circuits or elements connected to node ND1, and has a prescribed equivalent resistor.

P-channel MOS transistor P1 and N-channel MOS transistor N1 operate in response to the output signal from gate potential control circuit 4, and structure a current driver passing a current through node ND1. The voltage applied to power supply node Vcc connected to P-channel MOS transistor P1 changes in accordance with the operating condition of current drive circuit 2, as described later.

Gate potential control circuit 4 can control the operation of the current driver in response to drive condition signal to attain tristate condition. In other words, gate potential control circuit 4 can attain a first condition in which P-channel MOS transistor P1 and N-channel MOS transistor N1 are turned on and off, respectively, to charge node ND1, a second state in which P-channel MOS transistor P1 and N-channel MOS transistor N1 are turned off and on, respectively, to discharge node ND1, and a third state in which both of P-channel MOS transistor P1 and N-channel MOS transistor N1 are turned off.

Gate potential control circuit 4 operates based on the voltage supplied from power supply node and ground node (not shown). The voltage supplied to this gate potential control circuit 4 also changes in accordance with the operating condition of current drive circuit 2, which will be described later.

P-channel MOS transistor P2 and power supply node Vpre structure a precharged circuit. This precharge circuit precharges node ND1 to a prescribed voltage in waiting mode, i.e., where current drive circuit 2 does not cause a current to flow, and when current drive circuit 2 causes a current to flow, P-channel MOS transistor P2 is off and the circuit is deactivated.

In current drive circuit 2, voltage distribution for each power supply node is different depending on a current flow is present or not. Further, in absence of the current flow, the voltage distribution further differs depending on whether current drive circuit 2 is in standby state or not. In the following, the state in which current drive circuit 2 does not pass a current and being deactivated is referred to "waiting mode", and a state in which current drive circuit 2 does not pass current and being activated is referred to "standby mode", and a state in which current drive circuit 2 passes current is referred to "select mode".

FIG. 2 shows an operating condition of current drive circuit 2 in waiting mode. Referring to FIG. 2, in waiting mode, P-channel MOS transistor P2 is on and node ND1 is precharged to a prescribed potential. Load circuit 6 is in an off state, i.e., in not operating state.

FIG. 3 shows voltage distribution of current drive circuit 2 in waiting mode. Referring to FIG. 3, both of NAND gate G1 and AND gate G2 operate receiving supply voltage of 1.2V and ground voltage of 0V. Thus, gate potential Vg of P-channel MOS transistor P1 and N-channel MOS transistor N1 will be 1.2V and 0V, respectively. Both of power supply nodes Vcc, Vpre are applied with voltage of 1.2V. Since P-channel MOS transistor P2 is on, the voltage level of node ND1 is 1.2V.

Thus, in waiting mode, node ND1 is precharged to 1.2V. Therefore, even though P-channel MOS transistor P1 is configured with a transistor having thin gate insulating film involving larger leakage current as compared to a transistor having thick gate insulating film, since there is no voltage difference between source and drain of P-channel MOS transistor P1, the leakage current does not flow through P-channel MOS transistor P1.

Though it is not illustrated in the figures, considering the leakage current of N-channel MOS transistor N1, the voltage level applied to power supply node Vpre may be set such that precharge potential of node ND1 will be the intermediate potential between the potential applied to power supply node Vcc and the potential applied to ground node GND.

FIG. 4 shows an operating condition of current drive circuit 2 in standby mode. The operating condition of current drive circuit 2 in standby mode is the same as the operating condition in waiting mode shown in FIG. 2.

FIG. 5 shows the voltage distribution of current drive circuit 2 in standby mode. Referring to FIG. 5, in standby mode, NAND gate G1 operates receiving supply voltage of 2.5V and ground voltage of 1.2V. Thus, gate potential Vg of P-channel MOS transistor P1 will be 2.5V. To power supply node Vcc, voltage of 2.5V is applied. The voltage level of node ND1 is 1.2V.

Thus, during standby mode, the voltage level received at power supply node Vcc increases to 2.5V. Here, node ND1 is also precharged to 1.2V, thus the voltage difference between source and drain of P-channel MOS transistor P1 will be only 1.3V. Therefore, even though the gate insulating film of P-channel MOS transistor P1 is formed thinner than the gate insulating film of a conventional driver transistor, the reliability of the gate insulating film of P-channel MOS transistor P1 is maintained.

FIG. 6 shows an operating condition of current drive circuit 2 in select mode. Referring to FIG. 6, during select mode, P-channel MOS transistors P1, P2 are on and off, respectively, and load circuit 6 turns to an on state, i.e., to an operating state, and a current is supplied from power supply node Vcc to load circuit 6 via P-channel MOS transistor P1.

FIG. 7 shows voltage distribution of current drive circuit 2 in select mode. Referring to FIG. 7, the voltage level received by NAND gate G1, AND gate G2 and power supply node Vcc in select mode is the same as in standby mode. Gate potential Vg of P-channel MOS transistor P1 will be 1.2V in accordance with ground voltage level of NAND gate G1. The voltage level of node ND1 will be 1.0–1.5V, due to the voltage drop resulted from the equivalent resistor of load circuit 6.

Accordingly, during select mode, even though the voltage level of node ND1 rises from ground level, since the voltage level of power supply node Vcc has risen to 2.5V, the source-drain voltage of P-channel MOS transistor P1 is maintained in 1.5–1.0V. Therefore, P-channel MOS transistor P1 can be operated in saturation region, and the current drivability is maintained.

As the voltage level of power supply node Vcc rises to 2.5V, gate voltage Vg of P-channel MOS transistor P1 rises to 1.2V in accordance with ground voltage level of NAND gate G1, and thus the voltage difference between source and gate of P-channel MOS transistor P1 will be only 1.3V. Accordingly, even though the gate insulating film of P-channel MOS transistor P1 is formed thinner than the gate insulating film of a conventional driver transistor, the reliability of the gate insulating film of P-channel MOS transistor P1 is maintained.

In the foregoing, though the case where current drive circuit 2 supplies current to load circuit 6 (the first state of the tristate) has been described, it is also applicable to the case where current drive circuit 2 discharges node ND1 (the second state of the tristate). Specifically, during select mode, ground node GND connected to N-channel MOS transistor N1 may be applied with the voltage lower than the ground voltage, in order to improve the current drivability of N-channel MOS transistor N1.

Further, in the foregoing description, though power supply node Vcc is applied with the voltage of 2.5V or 1.2V, a voltage supply circuit may be provided that is connected to two power supply nodes applied with the voltage of 2.5V and 1.2V, respectively, for selecting either of power supply nodes depending on the operating condition of current drive circuit 2 to apply voltage to source of P-channel MOS transistor P1.

As above, with current drive circuit 2 according to the first embodiment, since source potential of the driver transistor rises during current driving, the source-drain voltage of driver transistor is maintained, and sufficient current drivability is maintained.

Additionally, according to current drive circuit 2, since the driver transistor can be operated in saturation region, the size of the transistor may be made smaller, and also stable driving current may be output irrespective of the fluctuation of supply voltage.

Further, according to current drive circuit 2, since excessive voltage will not be applied among gate, source and drain of the driver transistor, even though the driver transistor is configured with thin gate insulating film, the reliability of the gate insulating film may be maintained. With thin gate insulating film, the current drivability of driver transistor is increased.

Still further, according to current drive circuit 2, since each state of waiting mode, standby mode and select mode are established, it is applicable to a bit line current drive circuit of a semiconductor memory device which requires such states.

Second Embodiment

In a second embodiment, the current drive circuit described in the first embodiment is applied to MRAM device.

Figure 8:
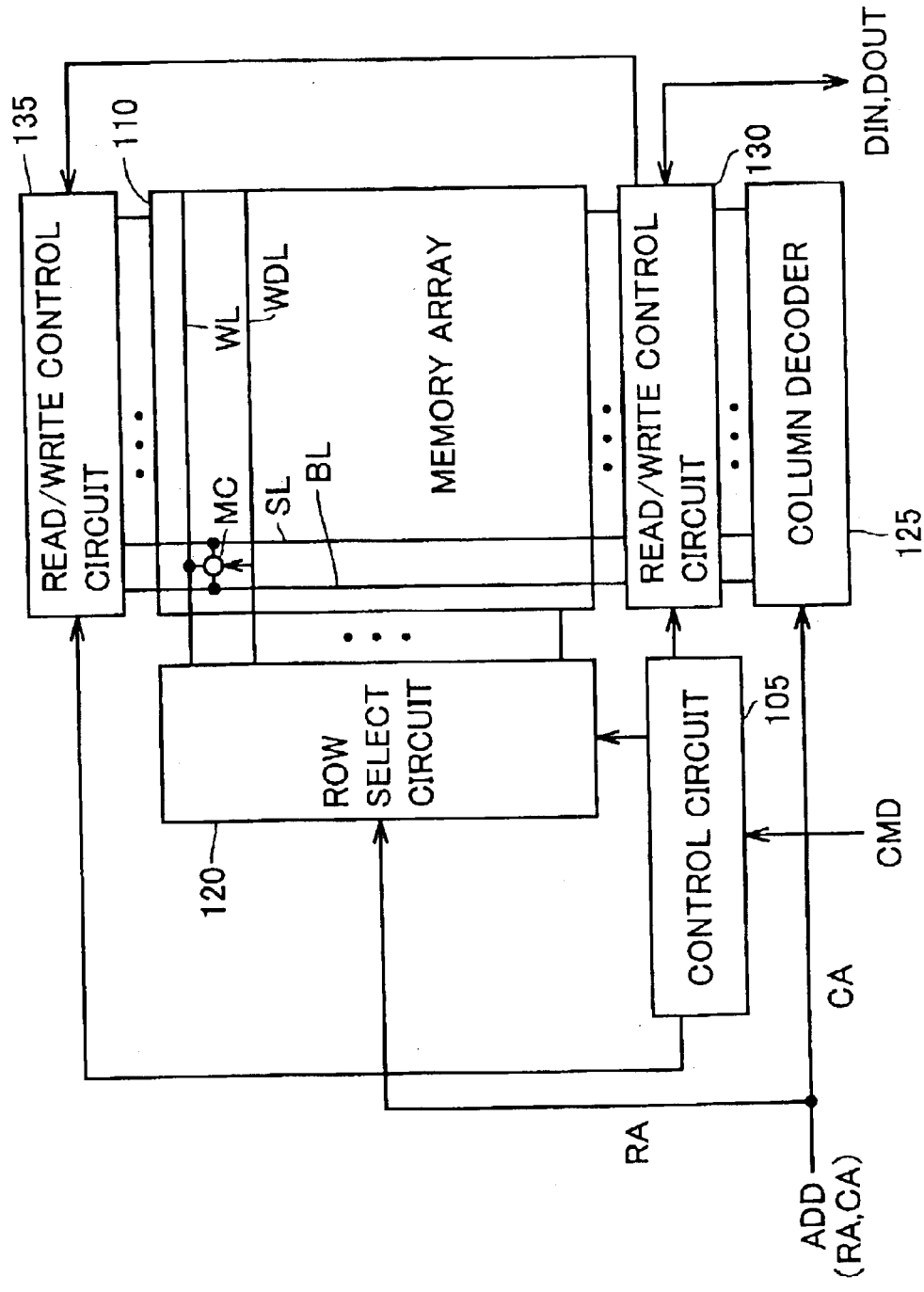
FIG. 8 is a schematic block diagram showing overall configuration of MRAM device according to a second embodiment.

FIG. 8 is a schematic block diagram showing the overall configuration of MRAM device according to the second embodiment the present invention. Referring to FIG. 8, MRAM device 100 performs random access in response to control circuit CMD and address signal ADD from the outside, and performs writing of input data DIN to, or reading of output data DOUT from, a memory cell selected as the subject of data reading/writing (hereinafter also referred to as "select memory cell").

MRAM device 100 includes a control circuit 105 controlling the overall operation of MRAM device 100 in response to control signal CMD, and a memory array 110 including memory cells MC arranged in rows and columns.

In memory array 110, word lines WL and write digit lines WDL are arranged corresponding to the rows of the memory cell, and bit lines BL and source lines SL are arranged corresponding to the columns of the memory cell. In FIG. 8, one memory cell MC is shown as representative, and the arrangement of corresponding word line WL, write digit line WDL, bit line BL and source line SL is illustrated.

MRAM device 100 further includes a row select circuit 120 executing row selection in accordance with a row address RA indicated by an address signal ADD, and a column decoder 125 executing column selection in memory array 110 based on a column address CA indicated by the address signal ADD, and read/write control circuits 130, 135.

Read/write control circuits 130, 135 generally express circuitry for executing a data reading operation and a data writing operation to and from memory cell MC arranged in memory array 110.

In the following, secondary high voltage state (e.g., supply voltage) and low voltage state (e.g., ground voltage) of a signal, a signal line and the like are also referred to as "H level" and "L level", respectively.

Next, the structure of a memory cell in MRAM device 100 will be described.

Figure 9:
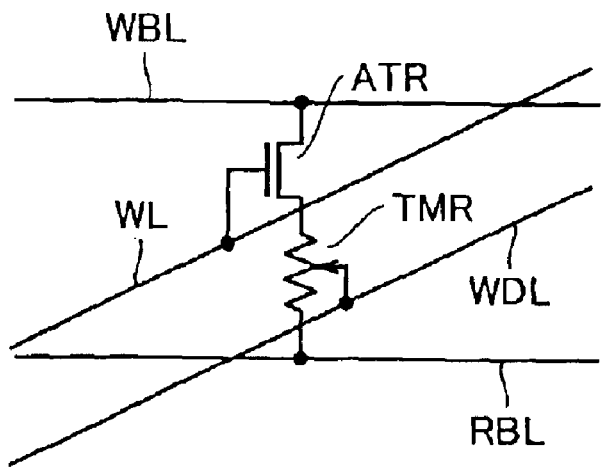
FIG. 9 is a schematic view showing the configuration of a memory cell of the MRAM device.

FIG. 9 is a schematic view showing the configuration of a memory cell of MRAM device 100. In the memory cell of MRAM, a magnetic thin film utilizing magnetic tunnel junction (MTJ) is used. In the following, the memory cell having magnetic tunnel junction is referred to as "MTJ memory cell".

Referring to FIG. 9, MTJ memory cell includes a tunnel magnetic resistor element TMR in which electric resistance changes in accordance with the data level of magnetically written stored data, and an access transistor ATR. Access transistor ATR is connected to tunnel magnetic resistor element TMR in series between write bit line WBL and read bit line RBL.

In data writing, a data write current flows through write bit line WBL in a different direction, and additionally a current also flows through write digit line WDL. Access transistor ATR is turned off. In data reading, word line WL is activated, and access transistor ATR is on. When access transistor ATR is on, tunnel magnetic resistor element TMR is electrically coupled between write bit line WBL set at ground voltage GND and read bit line RBL supplied with data reading current.

Figure 10:
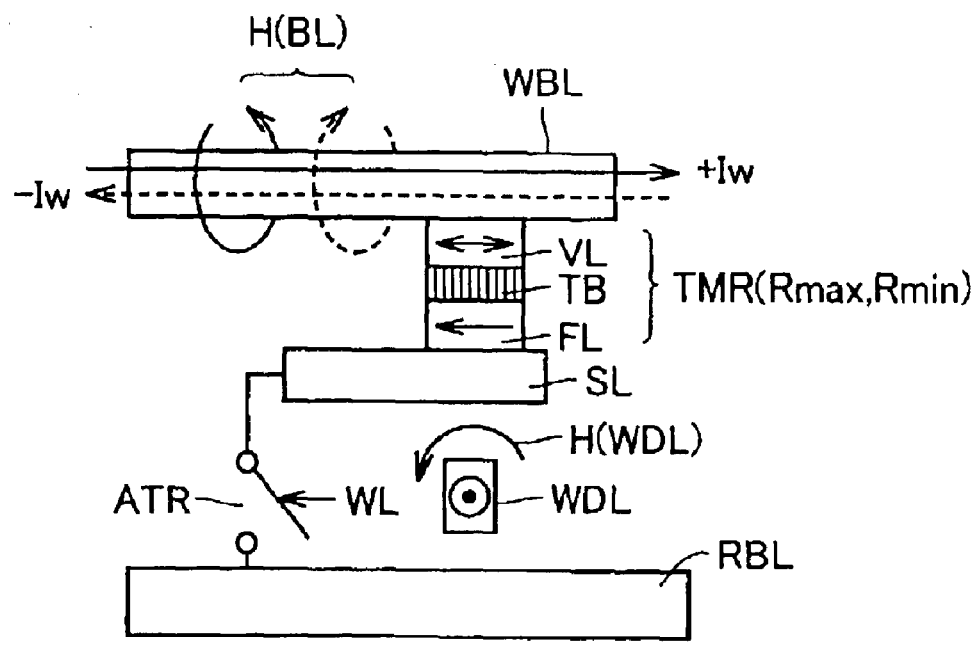
FIG. 10 is a conceptual illustration related to a description of a data writing operation to MTJ memory cell.

FIG. 10 is a conceptual illustration related to the description of a data writing operation to MTJ memory cell. Referring to FIG. 10, tunnel magnetic resistor element TMR includes a ferromagnetic layer FL having a fixed constant magnetization direction (hereinafter simply referred to as "fixed magnetization layer" also), and a ferromagnetic layer VL magnetized in the direction in accordance with an impressed magnetic field from the outside (hereinafter simply referred to as "free magnetization layer" also). Between fixed magnetization layer FL and free magnetization layer VL, a tunnel barrier (tunnel film) TB formed with insulating layer is provided. Free magnetization layer VL is either magnetized in the same direction with fixed magnetization layer FL or in the opposite direction (anti-parallel) to fix magnetization layer FL, depending on the level of written stored data. The magnetic tunnel junction is formed by these fixed magnetization layer FL, tunnel barrier TB and free magnetization layer VL.

The electric resistance of tunnel magnetic resistor element TMR changes in accordance with the relative relationship of magnetization directions of fixed magnetization layer FL and free magnetization layer VL. Specifically, the electric resistance of tunnel magnetic resistor element TMR takes the minimum value Rmin when the magnetization direction of fixed magnetization layer FL and that of free magnetization layer VL are in parallel, and takes the maximum value Rmax when those magnetization directions are in opposite (anti-parallel) directions.

In data writing, word line WL is deactivated, and access transistor ATR is turned off. In this state, respective write bit line WBL and write digit line WDL pass data writing currents for magnetizing free magnetization layer VL in a direction in accordance with the level of write data. Then, magnetic fields in accordance with the directions of the currents are generated in respective write bit line WBL and write digit line WDL, and the sum of these magnetic fields is applied to free magnetization layer VL. Then, by thus generated magnetic fields, free magnetization layer VL is magnetized in the direction parallel to the direction of an easy axis of magnetization along the fixed magnetization direction of fixed magnetization layer FL, or in the direction anti-parallel (opposite) thereto.

In order to change the stored data of MTJ memory cell, i.e., the magnetization direction of tunnel magnetic resistor element TMR, the data writing currents of at least a prescribed level must flow through both of write digit line WDL and write bit line WBL. The magnetization direction that has been written in tunnel magnetic resistor element TMR, i.e., the stored data of MTJ memory cell, will be retained in non-volatile manner until new data writing is executed.

Figure 11:
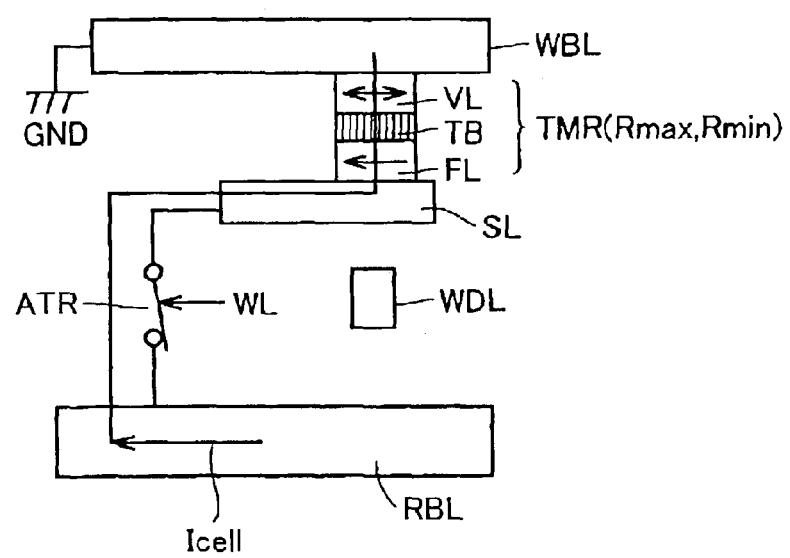
FIG. 11 is conceptual illustration related to a description of a data reading operation from MTJ memory cell.

FIG. 11 is a conceptual illustration related to the description of a data reading operation from MTJ memory cell. Referring to FIG. 11, in data reading, access transistor ATR is on in response to the activation of word line WL. Write bit line WBL is set at ground voltage GND. Accordingly, tunnel magnetic resistor element TMR is electrically coupled to read bit line RBL in the pull down state with ground voltage GND.

In this state, if read bit line RBL is pulled up with a predetermined voltage, then a memory cell current Icell in accordance with the electric resistance of tunnel magnetic resistor element TMR, i.e., in accordance with the level of stored data of MTJ memory cell, passes through the current path including read bit line RBL and tunnel magnetic resistor element TMR. Then, by comparing this memory cell current Icell and a prescribed reference current, the stored data is read from MTJ memory cell.

As above, since in tunnel magnetic resistor element TMR the electric resistance thereof changes in accordance with the magnetization direction that is rewritable in accordance with the applied data write magnetic field, the data can be stored in non-volatile manner by relating electric resistance Rmax and Rmin of tunnel magnetic resistor element TMR with the level of stored data ("1" and "0"), respectively.

Figure 12:
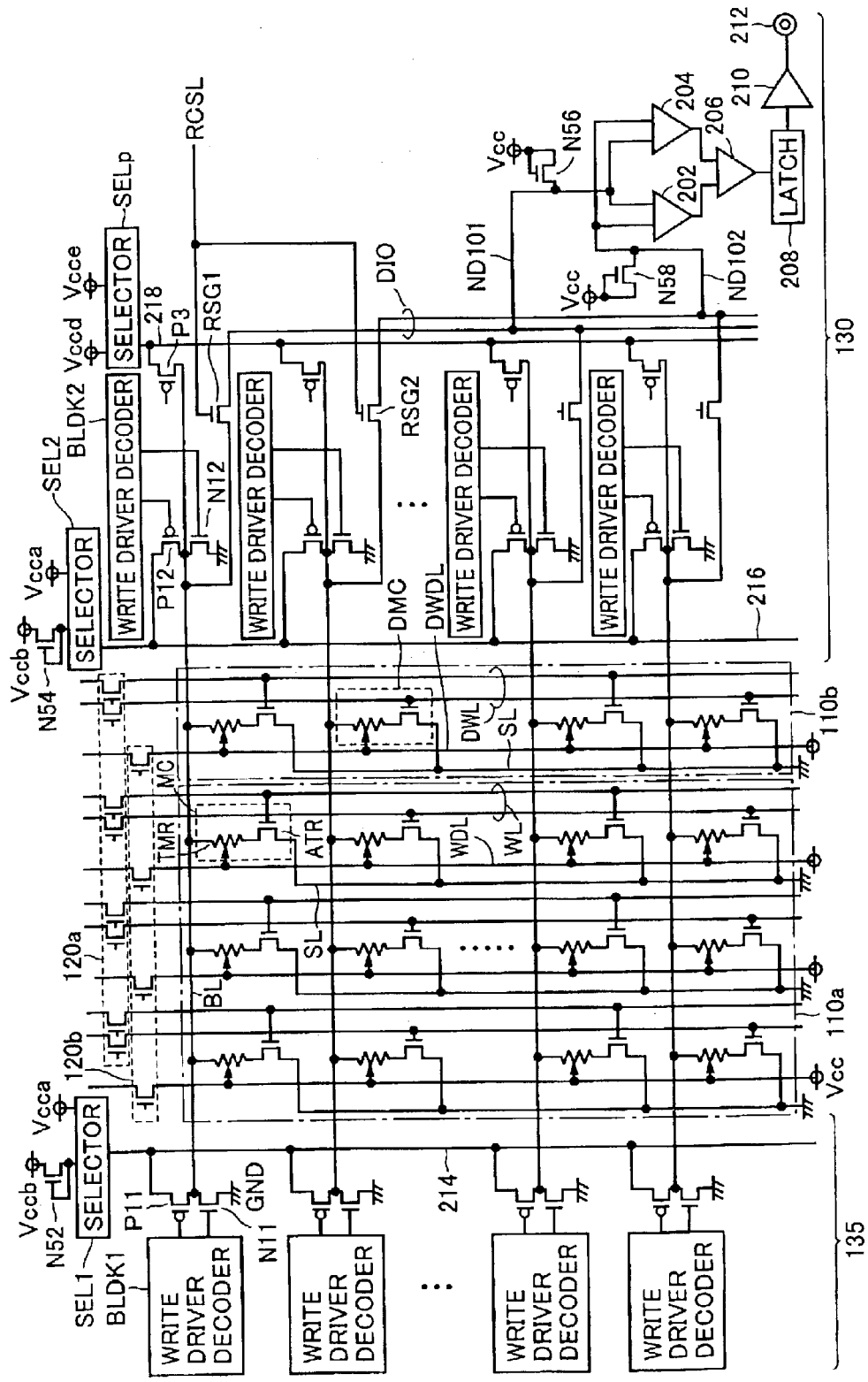
FIG. 12 is a circuit diagram showing the prime configuration of MRAM device according to the second embodiment.

FIG. 12 is a circuit diagram showing the prime configuration of MRAM device 100. Referring to FIG. 12, MTJ memory cell MC and dummy MTJ memory cell DMC are respectively provided to memory array 110a, 110b, and each of MTJ memory cell MC and dummy MTJ memory cell DMC includes tunnel magnetic resistor element TMR and access transistor ATR, which are arranged in series between corresponding bit line BL and source line SL. Dummy MTJ memory cell DMC is a memory cell for generating a reference current that is to be compared to memory cell current Icell flowing through MTJ memory cell MC, which is the subject of a read operation in data reading.

Read/write control circuit 130 includes a write driver decoder BLDK2, a P-channel MOS transistor P12 and an N-channel MOS transistor N12 structuring a current driver passing a current through a bit line, a selector SEL2, power supply nodes Vcca, Vccb, an N-channel MOS transistor N54, and node 216.

Write driver decoder BLDK2, P-channel MOS transistor P12 and N-channel MOS transistor N12 are provided for each bit line, and together with power supply node Vcca, Vccb, N-channel MOS transistor N54, selector SEL2 and node 216, structure a current drive circuit passing data writing current through the corresponding bit line BL.

P-channel MOS transistor P12 and N-channel MOS transistor N12 are configured with gate insulating films thinner than the gate insulating film of a driver transistor in a conventional MRAM device. P-channel MOS transistor P12 is connected to node 216 and corresponding bit line BL, and receives an output signal from write driver decoder BLDK2 at its gate. N-channel MOS transistor N12 is connected to the corresponding bit line BL and ground node above, and receives an output signal from write driver decoder BLDK2 at its gate.

Selector SEL2, power supply nodes Vcca, Vccb and N-channel MOS transistor N54 structure a voltage supplying circuit. Selector SEL2 is connected between power supply node Vcca as well as N-channel MOS transistor N54, and a node 216 connected to source of P-channel MOS transistor P12.

Power supply nodes Vcca, Vccb are applied with the voltage of 2.5V and 1.5V, respectively. Selector SEL2 receives voltage from power supply node Vcca, and from power supply node Vccb via N-channel MOS transistor N54, and selects power supply node Vcca during the active period and selects power supply node Vccb during inactive period to supply the voltage to node 216. N-channel MOS transistor N54 connected between power supply node Vccb and selector SEL2 is provided in order to further decrease the voltage level of node 216 from 1.5V when selector SEL2 selects power supply node Vccb during inactive period, and thus to reduce the leakage current between source and drain of P-channel MOS transistor P12.

Read/write control circuit 130 further includes a P-channel MOS transistor P3, a selector SELp, power supply nodes Vccd, Vcce, and a node 218. P-channel MOS transistor P3 is provided for each bit line, and along with selector SELp, power supply nodes Vccd, Vcce and node 218, configures a precharge circuit for precharging corresponding bit line BL to a prescribed voltage. P-channel MOS transistor P3 is connected to node 218 and corresponding bit line BL, and receives write bit line activation signal WACT (not shown) at its gate. Selector SELp is connected between power supply nodes Vccd, Vcce and node 218 connected to source of P-channel MOS transistor P3.

Power supply nodes Vccd, Vcce are applied with the voltages of 1.5V, 0.75V, respectively. Selector SELp receives the voltage from power supply nodes Vccd, Vcce, and selects power supply node Vccd during active period, and selects power supply node Vcce during inactive period to supply the voltage to node 218, as will be described later.

Read/write control circuit 130 data includes a read column line RCSL, read select gates RSG1, RSG2, a data line pair DIO, sense amplifiers 202–206, a latch circuit 208, and an output buffer 210.

Read/write control circuit 135 includes a write drive decoder BLDK1, a P-channel MOS transistor P11 and an N-channel MOS transistor N11 configuring current driver passing a current to a bit line, a selector SEL1, power supply nodes Vcca, Vccb, an N-channel MOS transistor N52, and node 214.

Read/write control circuit 135 is provided corresponding to the portion of current drive circuit of read/write control circuit 130. The configuration of read/write control circuit 135 is the same as the part of current drive circuit of read/write control circuit 135, and the description thereof will not be repeated.

Next, a data write operation and a read operation in MRAM device 100 will be described. The data write operation will be described later in detail referring to FIG. 13 and the following figures, and first the data read operation will be described.

In MRAM device 100, when reading data from MTJ memory cell MC enclosed with a dot line, the word line WL connected to that MTJ memory cell MC is activated by word line driver 120a. Simultaneously, a dummy word line DWL connected to a dummy MTJ memory cell DMC enclosed with a dot line is activated by word line driver 120a. When read column line RCSL is activated by a column decoder (not shown), read select gates RSG1, RSG2 turns on, and the select bit line and the bit line connected to dummy MTJ memory cell DMC are connected to data line pair DIO via read select gates RSG1, RSG2, respectively.

Then, a precharge current flows from data line pair DIO to the targeted MTJ memory cell MC and dummy MTJ memory cell DMC, and the voltage in accordance with the resistance value of MTJ memory cell MC and dummy MTJ memory cell DMC are generated at nodes ND101, ND102. Then the voltage difference between nodes ND101, ND102 is detected by sense amplifiers 202–206, and thus the data which have been stored in MTJ memory cell MC is read to data input/output terminal 212 via latch circuit 208 and output buffer 210.

Next, in MRAM device 100, data writing to MTJ memory cell MC enclosed with a dot line will be described.

Figure 13:
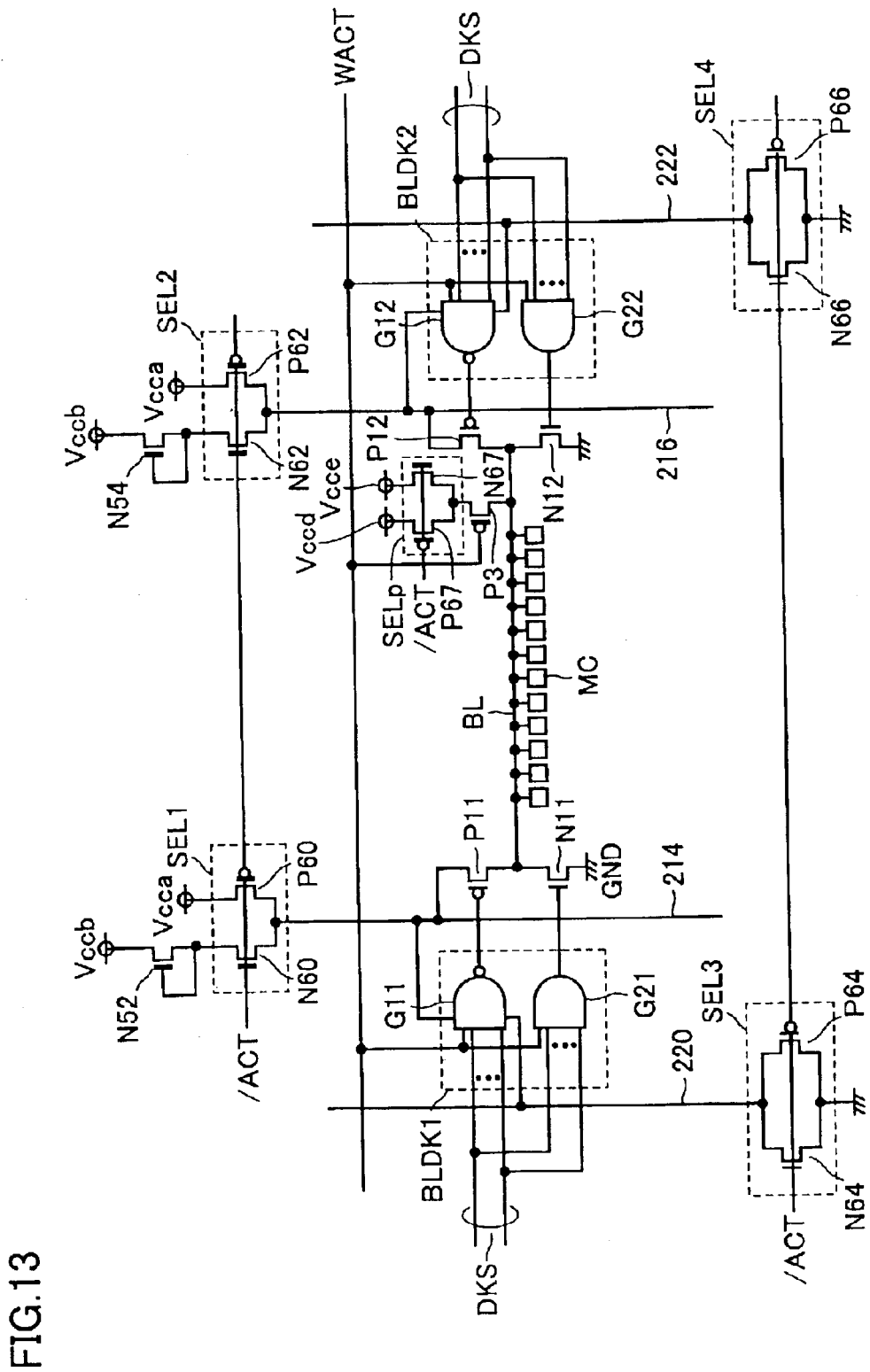
FIG. 13 is a circuit diagram related to a description of an operation in data writing of MRAM device according to the second embodiment.

FIG. 13 is a circuit diagram related to the description of the operation in data writing in MRAM device 100. FIG. 13 is a detailed description of the part related to data writing of MRAM device 100 shown in FIG. 12. Therefore, the description that overlaps with that of FIG. 12 will not be repeated.

Referring to FIG. 13, write driver decoder BLDK1 includes NAND gate G11 and AND gate G21. NAND gate G1 operates receiving voltage from nodes 214, 220. NAND gate G11 operates logical multiplication of a decode signal DKS received from column decoder 125 (not shown) and a write bit line activating signal WACT received from control circuit 105 (not shown), and outputs a signal inverting the operation result. AND gate G21 outputs a signal operating logical multiplication of decode signal DKS and write bit line activating signal WACT.

Selector SEL1 includes P-channel MOS transistor P60 and N-channel MOS transistor N60. MRAM device 100 further includes selector SEL3 that is not shown in FIG. 12. Selector SEL3 includes P-channel MOS transistor P64 and N-channel MOS transistor N64.

P-channel MOS transistor P60 and N-channel MOS transistors N60, N52 have thick gate insulating films which maintain the reliability of the gate insulating films applied with the voltage of 2.5V between the terminals. P-channel MOS transistor P60 is connected between power supply node Vcca and node 214, and receives chip activation signal/ACT at its gate. N-channel MOS transistor N60 is connected between N-channel MOS transistor N52 and node 214, and receives chip activation signal/ACT at its gate.

P-channel MOS transistor P64 and N-channel MOS transistor N64 is connected in parallel between node 214 and ground node, and receives chip activation signal/ACT at its gate. Here, threshold voltage of P-channel MOS transistor P64 is designed approximately at 1.2V.

Selector SELp includes a P-channel MOS transistor P67 and an N-channel MOS transistor N67. P-channel MOS transistor P67, N-channel MOS transistor N67 and P-channel MOS transistor P3 have thick gate insulating films. P-channel MOS transistor P67 is connected between power supply node Vccd and P-channel MOS transistor P3, and receives chip activation signal/ACT at its gate. N-channel MOS transistor N67 is connected between power supply node Vcce and P-channel MOS transistor P3, and receives chip activation signal/ACT at its gate.

Selectors SEL2, SEL4 are provided at the opposite side of a bit line corresponding to selectors SEL1, SEL3, respectively. The configurations of selectors SEL2, SEL4 are the same as that of selectors SEL1, SEL3, therefore the description thereof will not be repeated.

In MRAM device 100, in waiting mode where chip activation signal/ACT is at H level, bit line BL is precharged by the voltage applied thereto from power supply node Vcce via N-channel MOS transistor N67 and P-channel MOS transistor P3. In selectors SEL1, SEL2, N-channel MOS transistors N60, N62 are on, respectively, and power supply node Vccb is selected. In selectors SEL3, SEL4, N-channel MOS transistors N64, N66 are on, respectively, and the voltage level of nodes 220, 222 are at ground level.

When chip activation signal/ACT goes L level, and the memory array is activated, P-channel MOS transistors P60, P62 are on in selectors SEL1, SEL2, respectively, power supply node Vcca is selected, and the voltage level of nodes 214, 216 rises. P-channel MOS transistors P64, P66 are on in selector SEL3, SEL4, respectively. Here, as described above, the threshold value of P-channel MOS transistors P64, P66 is designed at 1.2V, therefore when P-channel MOS transistors P64, P66 are on, nodes 220, 222 are clamped at 1.2V, respectively.

Though it is not illustrated, in selector SEL3, the P-channel MOS transistor with a diode connection may be connected to P-channel MOS transistor P64 in series, and the threshold value of these two P-channel MOS transistors may be designed to be 0.6V. In this case also, nodes 220, 222 are clamped at 1.2V, respectively. It is also applicable to selector SEL4.

In selector SELp, P-channel MOS transistor P67 is on, and bit line BL is precharged by power supply node Vccd. Specifically, the voltage level of bit line BL rises in accordance with the rising voltage level of nodes 214, 216.

The state where memory array is activated and the bit line is not driven is referred to as "standby mode" in accordance with the description of the first embodiment.

Then, after the memory array is activated, when writing a data of H level ("1") to the selected MTJ memory cell MC, write bit line activation signal WACT of corresponding bit line goes H level, and P-channel MOS transistor P11 and N-channel MOS transistor N11 are turned on and off, respectively, by write drive decoder BDLK1, and P-channel MOS transistor P12 and N-channel MOS transistor N12 are turned off and on, respectively, by write driver decoder BLDK2. Thus, data write current +Iw flows in the direction from P-channel MOS transistor P11 to N-channel MOS transistor N12.

In contrast thereto, when writing a data of L level ("0") to MTJ memory cell MC, P-channel MOS transistor P11 and N-channel MOS transistor N11 are turned off and on, respectively, by write driver decoder BLDK1, and P-channel MOS transistor P12 and N-channel MOS transistor N12 are turned on and off, respectively, by write drive decoder BLDK2. Then, data write current −Iw flows in the direction from P-channel MOS transistor P12 to N-channel MOS transistor N11.

In this state, write digit line driver 120b (not shown) activates write digit line WDL connected to MTJ memory cell MC to be written the data, and write data in accordance with the direction of data write current ±Iw is magnetically written to MTJ memory cell MC provided at the intersection of bit line BL and write digit line WDL through which data write current flows. The state where data write current flows through bit line BL is referred to as "select mode" in accordance with the description of the first embodiment.

FIGS. 14 to 20 are related to the description of voltage distribution of the current drive circuit in waiting mode, standby mode, and select mode above.

Figures 14, 15, 16:
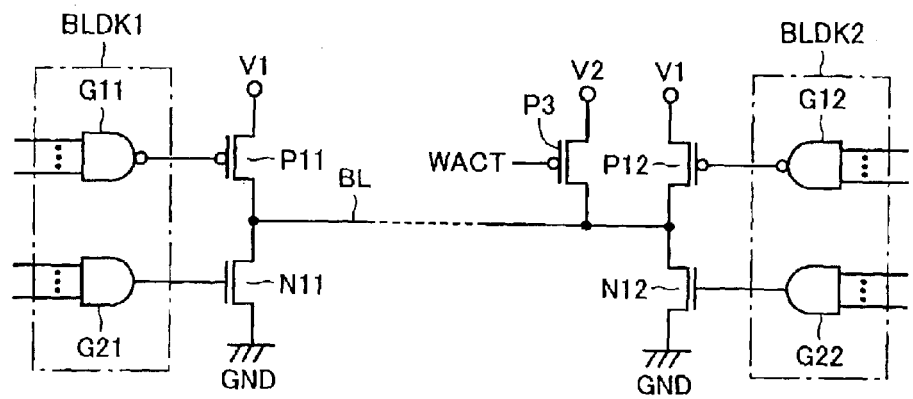
FIG. 14 is a circuit diagram schematically showing the prime configuration of the current drive circuit in MRAM device according to the second embodiment related to descriptions of voltage distribution of the current drive circuit.
FIG. 15 shows an operating condition of the current drive circuit shows in FIG. 14 in waiting mode.
FIG. 16 shows voltage distribution of the current drive circuit shown in FIG. 14 in waiting mode.

FIG. 14 is a circuit diagram schematically showing the prime configuration of current drive circuit for the following description of voltage distribution in MRAM device 100. Referring to FIG. 14, voltage V1 corresponds to the voltage of nodes 214, 216 shown in FIG. 13, and voltage V2 corresponds to the voltage of output node of selector SELp.

FIG. 15 shows an operating condition of current drive circuit shown in FIG. 14 in waiting mode. Referring to FIG. 15, P-channel MOS transistor P3 is on, and bit line BL is precharged to a prescribed potential. Other P-channel MOS transistors P11, P12 and N-channel MOS transistors N11, N12 are off.

FIG. 16 shows voltage distribution of current drive circuit shown in FIG. 14 in waiting mode. Referring to FIG. 16, NAND gates G11, G12 and AND gates G21, G22 all operate receiving supply voltage of 1.2V and ground voltage of 0V. Thus, gate potential Vg of P-channel MOS transistors P11, P12 will be 1.2V, and gate potential Vg of N-channel MOS transistors N11, N12 will be 0V. Voltages V1, V2 will be 1.2V and 0.6V, respectively, and the voltage VBL of bit line BL will be 0.6V.

As above, in waiting mode, bit line BL is precharged to 0.6V. Therefore, in P-channel MOS transistors P11, P12 and N-channel MOS transistors N11, N12, the voltage difference between source and drain is suppressed smaller, thus even though each transistor is configured with a transistor having thin gate insulating film involving larger leakage current as compared to a transistor with thick gate insulating film, the leakage current in each transistor is suppressed greatly.

FIG. 17 shows an operating condition of current drive circuit shown in FIG. 14 in standby mode. The operating condition of the current drive circuit in standby mode is the same as in waiting mode shown in FIG. 15.

FIG. 18 shows voltage distribution in the current drive circuit shown in FIG. 14 in standby mode. Referring to FIG. 18, in standby mode, NAND gates G11, G12 operate receiving supply voltage of 2.5V and ground voltage of 1.2V. Accordingly, gate potential Vg of P-channel MOS transistors P11, P12 will be 2.5V. Voltages V1, V2 will be 2.5V and 1.2V, respectively, and voltage VBL of bit line BL will be 1.2V.

As above, in standby mode, source voltage of P-channel MOS transistors P11, P12 rises to 2.5V. Here, since the precharge voltage of bit line BL also rises to 1.2V, the voltage difference between source and drain of respective P-channel MOS transistors P11, P12 will be only 1.3V. Thus, even though the gate insulating films of P-channel MOS transistors P11, P12 are formed thinner than the gate insulating films of conventional driver transistor, the reliability of gate insulating films of P-channel MOS transistors P11, P12 is maintained.

FIG. 19 shows an operating condition of the current drive circuit shown in FIG. 14 in select mode. Here, the case where a data of H level is written is shown. Specifically, referring to FIG. 19, in select mode, P-channel MOS transistors P11, P12 are on and off, respectively, and N-channel MOS transistors N11, N12 are off and on, respectively. Therefore, data write current +Iw flows through bit line BL in the direction from P-channel MOS transistor P11 to N-channel MOS transistor N12.

FIG. 20 shows voltage distribution in the current drive circuit shown in FIG. 14 in select mode. Referring to FIG. 20, the voltage level received at NAND gates G11, G12 and AND gates G12, G22 and voltages V1, V2 in select mode are the same as in standby mode. Gate potential Vg of P-channel MOS transistor P11 will be 1.2V in accordance with ground voltage level of NAND gate G11. When drive current amount is α, channel resistance of N-channel MOS transistor N12 is β, and wiring resistance of bit line BL is Rbl, then voltage VBL of bit line BL will be VBL=α×(β+Rbl), which value will be 1.0–1.5V.

As above, voltage VBL of bit line BL rises from ground level in select mode, since voltage V1 has been risen to 2.5V, source-drain voltage of P-channel MOS transistor P11 is maintained in 1.5–1.0V. Therefore, P-channel MOS transistor P11 can be operated in saturation region, and the current drivability is maintained.

Since gate potential Vg of P-channel MOS transistor P11 rises to 1.2V in accordance with ground voltage level of NAND gate G11 as voltage V1 rises to 2.5V, voltage difference between source and gate of P-channel MOS transistor P11 will be only 1.3V. Therefore, even though the gate insulating film of P-channel MOS transistor P11 is formed thinner than the gate insulating film of a conventional drive transistor, the reliability of the gate insulating film of P-channel MOS transistor P11 is maintained.

When a data of L level is to be written, the operating manner of P-channel MOS transistor P11 is applicable to P-channel MOS transistor P12.

In the foregoing, though P-channel MOS transistors P11, P12 which supply current to bit line BL has been described, their manner is also applicable to N-channel MOS transistors N11, N12 which discharge bit line BL. Specifically, in select mode, ground node GND connected to N-channel MOS transistors N11, N12 may be applied with lower voltage as compared to ground voltage level, in order to improve the current drivability of N-channel MOS transistors N11, N12.

Figure 21:
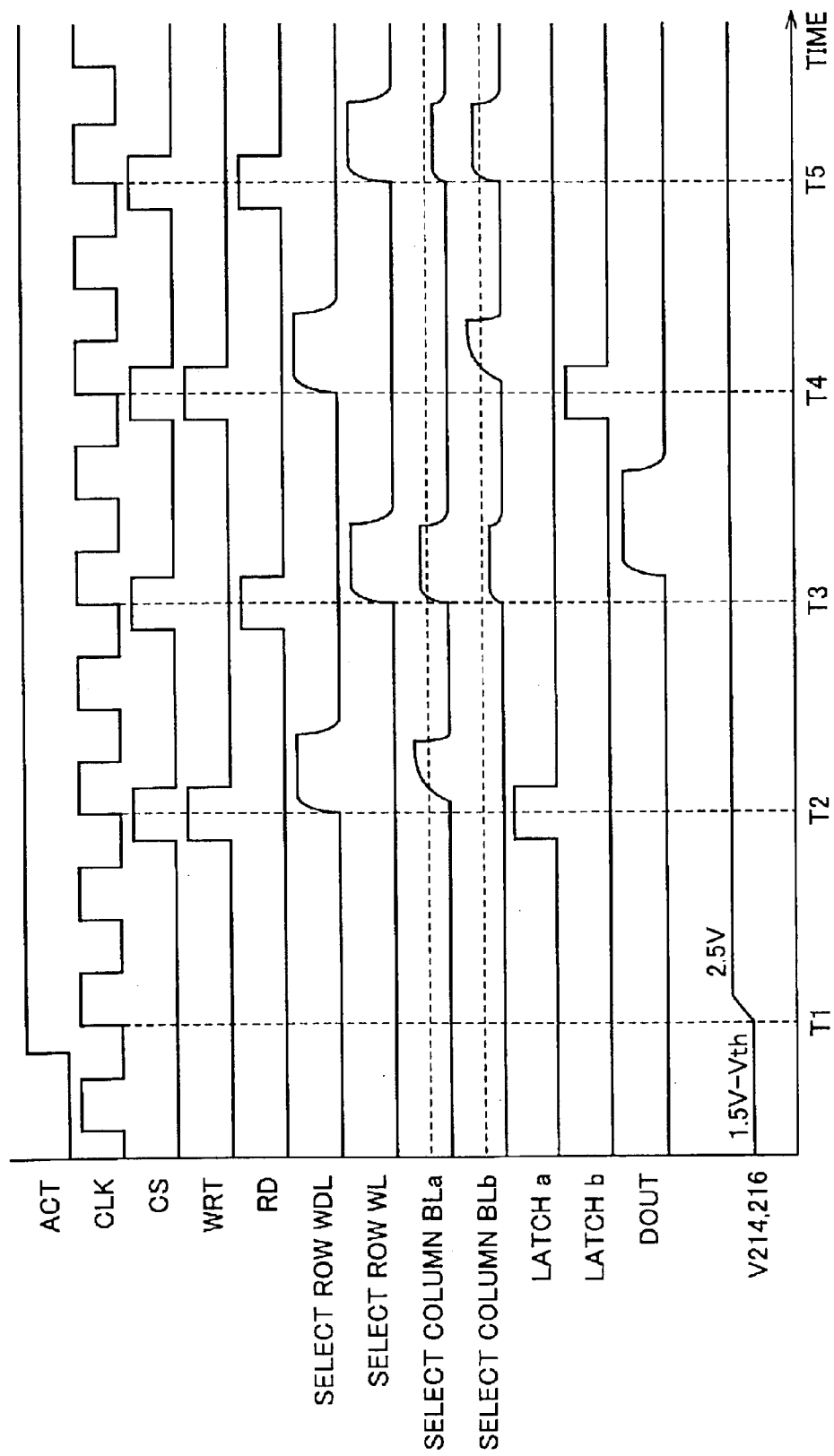
FIG. 21 is an operation waveform diagram related to a description of data reading/writing operations of MRAM device according to the second embodiment.

FIG. 21 is an operating waveform diagram showing data reading and writing operation for the aforementioned MRAM device 100. Referring to FIG. 21, MRAM device 100 operates synchronizing to clock signal CLK. After power-on prior to time point P1, the voltages V214, V216 of the nodes 214, 216 supplying source voltage of P-channel MOS transistors P11, P12 will be 1.5V–Vth. Here, Vth is the threshold voltage of N-channel MOS transistors N52, N54 shown in FIG. 13. Vth is designed approximately at 0.3V, therefore V214, V216 will approximately be 1.2V.

At time point T1, when chip activation signal ACT goes H level, P-channel MOS transistors P60, P62 are on, respectively in selectors SEL1, SEL2, and V214, V216 rise to 2.5V.

At time point T2, when chip select signal CS and write command WRT are taken, simultaneously write data is taken and latched (latch a). Then data write current Ip flows through write digit line WDL of select row, and data write current +Iw flows through bit line BLa of select column, thus data of a prescribed level ("1") is written to select memory cell.

As shown in the figure, the rising edge of data write current +Iw is moderate. If data write current ±Iw is passed through select bit line suddenly, a magnetic field is generated due to the sudden change of the current flowing through bit line, which induces a noise in adjacent bit lines, which in turn rewrites data accumulated in tunnel magnetic resistor element TMR. By the moderate rising edge, this can be prevented.

At time point T3, when chip select signal CS and read command RD are taken, word line WL of select row and dummy word line DWL (not shown) are activated. Then, bit line BLb and bit line BLa of select column are supplied with data read current Is. Data read current Is is supplied to bit line BLb in order to read dummy data from dummy MTJ memory cell DMC connected to bit line BLb. The voltages generated in bit lines BLa by data read current Is, BLb are transmitted to data line pair DIO, and the voltage difference between the data lines of data line pair DIO is detected by sense amplifiers 202–206, and then data "1" is output as read data DOUT.

Subsequently, at time point T4, when chip select signal CS and write command WRT are taken, simultaneously write data is taken and latched (latch b). Then, data write current Ip flows through write digit line WDL of select row, and data write current –Iw flows through bit line BLb of select column, thus data of a prescribed level ("0") is written to select memory cell. The rising edge of data write current –Iw is moderate based on the same reason as data write current +Iw.

At time point T5, when chip select signal CS and read command RD are taken, word line WL of select row and dummy word line DWL (not shown) are activated. Then, bit line BLa and bit line BLb of select column are supplied with data read current Is. Data read current Is is supplied to bit line BLa in order to read dummy data from dummy MTJ memory cell DMC connected to bit line BLa. The voltages generated in bit lines BLa by data read current Is, BLb are transmitted to data line pair DIO, and the voltage difference between the data lines of data line pair DIO is detected by sense amplifiers 202–206, and then data "0" is output as read data DOUT.

As above, with MRAM device 100 according to the second embodiment, even though the driver transistor of the current drive circuit is formed with thin gate insulating film, the reliability of the gate insulating film is maintained, and the current drivability of the current drive circuit is maintained.

Further, according to MRAM device 100, even though the driver transistor is formed with thin gate insulating film, gate leakage current and source-drain leakage current are greatly decreased.

Third Embodiment

In a third embodiment of the present invention, a current drive circuit in which driver transistor is configured with an N-channel MOS transistor will be described.

Figures 22, 23, 24:
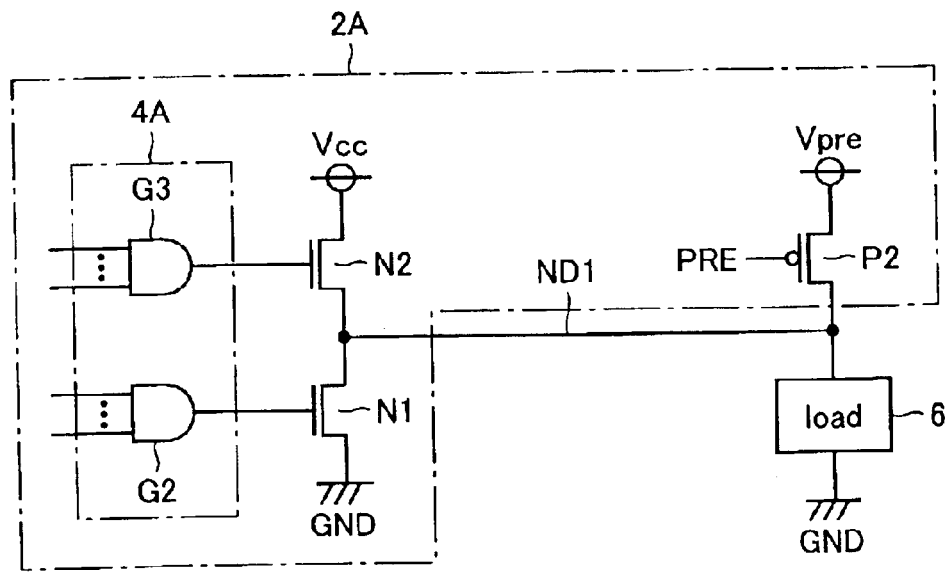
FIG. 22 is a circuit diagram showing the configuration of a current drive circuit according to a third embodiment.
FIG. 23 shows an operating condition of the current drive circuit according to the third embodiment in waiting mode.
FIG. 24 shows voltage distribution of current drive circuit according to the third embodiment in waiting mode.

FIG. 22 is a circuit diagram showing the configuration of a current drive circuit according to a third embodiment.

Referring to FIG. 22, a current drive circuit 2A has the configuration of current drive circuit 2 according to the first embodiment, only that P-channel MOS transistor P1 is replaced by an N-channel MOS transistor N2, and gate potential control circuit 4 is replaced by gate potential control circuit 4A. Gate potential control circuit 4A has the configuration of gate potential control circuit 4, only that NAND gate G1 is replaced by an AND gate G3.

N-channel MOS transistor N2, similarly to N-channel MOS transistor N1 and P-channel MOS transistor P2, is configured with thin gate insulating film as compared to the gate insulating film of a driver transistor in a conventional current drive circuit. AND gate G3 outputs a signal operating logical multiplication of at least one drive condition signal. AND gate G3 also operates based on the voltage supplied from power supply node and ground node (not shown) similarly to AND gate G2. The voltage supplied to AND gate G3 changes, as will be described later, according to operating conditions of current drive circuit 2A, i.e., waiting mode, standby mode and select mode as described in the first embodiment.

The rest of the configuration of current drive circuit 2A is the same as that of current drive circuit 2 according to the first embodiment, therefore the description thereof will not be repeated.

FIG. 23 shows an operating condition of current drive circuit 2A in waiting mode. Referring to FIG. 23, in waiting mode, P-channel MOS transistor P2 is on, and node ND1 is precharged to a prescribed potential. Load circuit 6 is in an off state, i.e., not operating.

FIG. 24 shows voltage distribution in current drive circuit 2A in waiting mode. Referring to FIG. 24, both of AND gate G3, G2 operate receiving supply voltage of 1.2V and ground voltage of 0V. Thus, gate potential Vg of N-channel MOS transistors N2, N1 will be both 0V. Additionally, to power supply nodes Vcc, Vpre, voltage of 1.2V is applied. Since P-channel MOS transistor P2 is on, the voltage level of node ND1 is 1.2V.

As above, node ND1 is precharged to 1.2V in waiting mode. Therefore, even though N-channel MOS transistor N2 is configured with a transistor having thin gate insulating film involving larger leakage current as compared to a transistor having thick gate insulating film, there is no voltage difference between drain and source of N-channel MOS transistor N2, and thus the leakage current does not flow through N-channel MOS transistor N2.

Though it is not illustrated, considering the leakage current of N-channel MOS transistor N1, the voltage level applied to power supply node Vpre may be designed such that precharge potential of node ND1 will be an intermediate potential between the potential applied to the power supply node Vcc and ground potential.

FIG. 25 shows an operating condition of current drive circuit 2A in standby mode. The operating condition of drive current circuit 2A in standby mode is the same as in waiting mode shown in FIG. 23.

FIG. 26 shows voltage distribution in voltage drive circuit 2A in standby mode. Referring to FIG. 26, AND gate G3 operates receiving supply voltage of 3.0V and ground voltage of 1.2V. Thus, gate potential Vg of N-channel MOS transistor N2 will be 1.2V. To power supply node Vcc, the voltage of 2.5V is applied. The voltage level of node ND1 is 1.2V.

Supply voltage level of AND gate G3 is set higher than the voltage level of power supply node Vcc, in order to maintain sufficient voltage between gate and source of N-channel MOS transistor N2 when N-channel MOS transistor N2 is on in select mode, which will be described below, to maintain the current drivability.

Thus, the voltage received at power supply node Vcc in standby mode rises to 2.5V. Here, gate potential Vg of N-channel MOS transistor N2 also rises to 1.2V, and node ND1 is precharged to 1.2V, thus the voltage difference between source and drain as well as gate and drain of N-channel MOS transistor N2 will be only 1.3V. Therefore, even though the gate insulating film of N-channel MOS transistor N2 is formed thinner than the gate insulating film of a conventional driver transistor, the reliability of the gate insulating film of N-channel MOS transistor N2 is maintained.

FIG. 27 shows an operating condition of current drive circuit 2A in select mode. Referring to FIG. 27, in select mode, N-channel MOS transistor N2 and P-channel MOS transistor P2 are on and off respectively, load circuit 6 is on, i.e., in operating state, and a current is supplied from power source node Vcc to load circuit 6 via N-channel MOS transistor N2.

FIG. 28 shows voltage distribution and current drive circuit 2A in select mode. Referring to FIG. 28, the voltage level received at AND gate G3, G2 and power supply node Vcc is the same as in standby mode. Gate potential Vg of N-channel MOS transistor N2 will be 3.0V in accordance with supply voltage level of AND gate G3. The voltage level of node ND1 will be 1.0–1.5V due to the voltage drop resulted from equivalent resistor of load circuit 6.

As above, in select mode, though the voltage level of node ND1 rises from the ground level, since the voltage level of power supply node Vcc rises to 2.5V, the voltage between drain and source of N-channel MOS transistor N2 is maintained in 1.5–1.0V. The gate potential Vg of N-channel MOS transistor N2 will be 3.0V, i.e., raised further from the voltage level of power supply node Vcc. Therefore, N-channel MOS transistor N2 may be operated in saturation region, and thus the current drivability is maintained.

In the foregoing, though the case where current drive circuit 2A supplies current to load circuit 6 (the first state of tristate) has been described, it is also applicable to the case where current drive circuit 2A discharges node ND1 (the second state of the tristate), as has been described in the first embodiment.

As above, according to current drive circuit 2A of the third embodiment of the present invention also, the effect similar to that of current drive circuit 2 according to the first embodiment can be attained.

Fourth Embodiment

In a fourth embodiment, the current drive circuit as described in the third embodiment is applied to MRAM device.

The overall configuration of MRAM device 100A according to the fourth embodiment is the same as that of MRAM device 100 according to the second embodiment shown in FIG. 8, and thus the description thereof will not be repeated.

Figure 29:
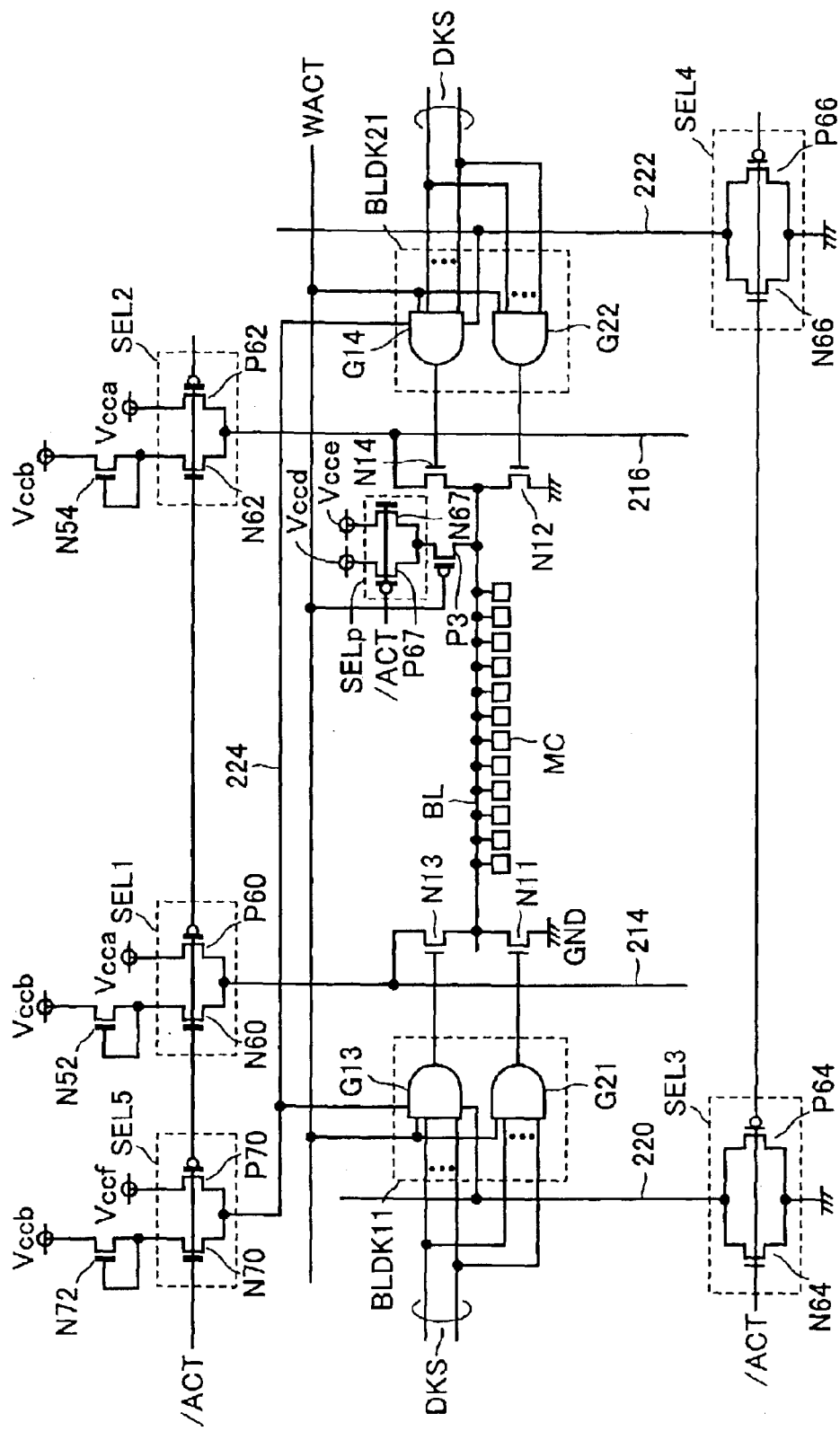
FIG. 29 is a circuit diagram related to a description of an operation in data writing of MRAM device according to a fourth embodiment.

FIG. 29 is a circuit diagram related to the description of the operation of MRAM device 100A in data writing. Referring to FIG. 29, MRAM device 100A has the configuration of MRAM device 100 shown in FIG. 13, and further includes a selector SEL5, power supply nodes Vccb, Vccf, and an N-channel MOS transistor N72. P-channel MOS transistors P11, P12 are replaced by N-channel MOS transistors N13, N14, and write driver decoders BLDK1, BLDK2 are replaced by write driver decoders BLDK11, BLDK21.

Selector SEL5, power supply nodes Vccb, Vccf and N-channel MOS transistor N72 structure a voltage supplying circuit supplying voltage to write drive decoders BLDK11, BLDK21. Selector SEL5 is connected between power supply node Vccb, N-channel MOS transistor N72, and node 224.

Selector SEL5 is formed with P-channel MOS transistor P70 and N-channel MOS transistor N70. P-channel MOS transistor P70 and N-channel MOS transistors N70, N72 have thick gate insulating films that can maintain reliability of the gate insulating films even when applied with the voltage of 2.5V between the terminals. P-channel MOS transistor P70 is connected between power supply node Vccf and node 224, and receives chip activation signal/ACT at its gate. N-channel MOS transistor N70 is connected between N-channel MOS transistor N72 and node 224, and receives chip activating signal/ACT at its gate.

Power supply node Vccf is applied with the voltage of 3.0V. Selector SEL5 receives the voltage from power supply node Vccf and power supply node Vccb via N-channel MOS transistor N72, and selects power supply node Vccf during active period, and selects power supply node Vccb during inactive period, to supply voltage to node 224.

AND gate G13 operates receiving supply voltage from node 224 and ground voltage from node 220, and AND gate G14 operates receiving supply voltage from node 224 and ground voltage from node 222.

The rest of the configuration of MRAM device 100A shown in FIG. 29 is the same as that of MRAM device 100 according to the second embodiment shown in FIG. 13, and thus the description thereof will not be repeated.

In waiting mode where chip activation signal/ACT is at H level, in selector SEL5, N-channel MOS transistor N70 is on, power supply node Vccb is selected, and AND gate G13, G14 is supplied with a voltage of 1.2V via node 224.

In standby mode where chip activation signal/ACT goes L level and the memory array is activated, in selector SEL5, P-channel MOS transistor P70 is on, power supply node Vccf is selected, and the voltage level of node 224 rises to 3.0V. In selectors SEL3, SEL4, respective P-channel MOS transistors P64, P66 are on, and respective nodes 220, 222 are clamped to 1.2V.

In select mode, when writing a data of H level ("1") to a selected MTJ memory cell MC, write bit line activation signal WACT of corresponding bit line goes H level, and by write driver decoder BLDK11 N-channel MOS transistors N13, N11 are turned on and off, respectively, and by write drive decoder BLDK21 N-channel MOS transistors N14, N12 are turned off and on, respectively. Then, data write current +Iw flows in the direction from N-channel MOS transistor N13 to N-channel MOS transistor N12.

In contrast thereto, when writing a data of L level ("0") to MTJ memory cell MC, by write drive decoder BLDK11 N-channel MOS transistors N13, N11 are turned off and on, respectively, and by write driver decoder BLDK21 N-channel MOS transistors N14, N12 are turned on and off, respectively. Then, data write current –Iw flows in the direction from N-channel MOS transistor N14 to N-channel MOS transistor N11.

In this state, by write digit line driver 120b (not shown), write digit line WDL, connected to MTJ memory cell MC to be written a data, is activated, and a write data is magnetically written to MTJ memory cell MC arranged at the intersection of bit line BL and write digit line WDL through which current is passed, in the direction corresponding to data write current ±Iw.

FIGS. 30 to 36 are diagrams and tables related to the description of voltage distribution of the current drive circuit in the aforementioned waiting mode, standby mode and select mode.

Figures 30, 31, 32:
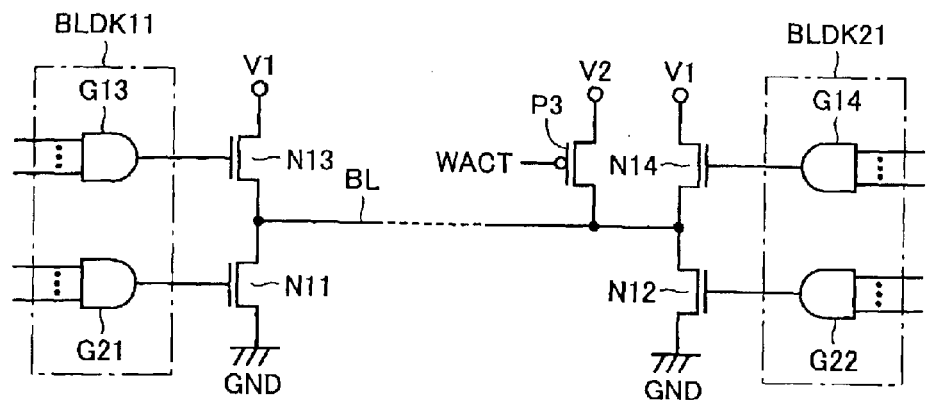
FIG. 30 is a circuit diagram schematically showing the prime configuration of the current drive circuit in MRAM device according to the fourth embodiment related to descriptions of voltage distribution of current drive circuit.
FIG. 31 shows an operating condition of the current drive circuit shown in FIG. 30 in waiting mode.
FIG. 32 shows voltage distribution of the current drive circuit shown in FIG. 30 in waiting mode.

FIG. 30 is a circuit diagram schematically showing the prime configuration of the current drive circuit in MRAM device 100A for describing herein voltage distribution therein. Referring to FIG. 30, voltage V1 corresponds to the voltage of nodes 214, 216 shown in FIG. 29, and voltage V2 corresponds to the voltage of output node of selector SELp.

FIG. 31 shows an operating condition of current drive circuit shown in FIG. 30 in standby mode. Referring to FIG. 31, in waiting mode, P-channel MOS transistor P3 is on, and bit line BL is precharged to a prescribed potential. Other N-channel MOS transistors N11–N14 are all are off.

FIG. 32 shows voltage distribution in waiting mode of the current drive circuit shown in FIG. 30. Referring to FIG. 32, AND gates G13, G14, G21, and G22 all operate receiving supply voltage of 1.2V and ground voltage of 0V. Thus, the gate potential Vg of N-channel MOS transistors N11–N14 are 0V. Additionally, voltages V1, V2 will be 1.2V, 0.6V, respectively, and voltage VBL of bit line BL will be 0.6V.

Thus, in waiting mode, bit line BL is precharged to 0.6V. Therefore, in N-channel MOS transistors N11–N14, the voltage difference between source and drain is suppressed smaller, and even though each transistor is configured with a transistor having a thin gate insulating film involving larger leakage current as compared to a transistor having thick gate insulating film, the leakage current in each transistor is greatly suppressed.

FIG. 33 shows an operating condition of the current drive circuit shown in FIG. 30 in standby mode. The operating condition of the current drive circuit in standby mode is the same as in waiting mode shown in FIG. 31.

FIG. 34 shows voltage distribution of the current drive circuit shown in FIG. 30 in standby mode. Referring to FIG. 34, in standby mode, AND gates G13, G14 operate receiving supply voltage of 3.0V and ground voltage of 1.2V. Thus, the gate potential Vg of N-channel MOS transistors N13, N14 will be 1.2V. Note that, since the threshold voltage of N-channel MOS transistors N13, N14 is designed to be at least 1.2V, they are in an OFF state. Additionally, voltages V1, V2 will be 2.5V, 1.2V, respectively, and voltage VBL of bit line BL will be 1.2V.

As above, the drain voltage of N-channel MOS transistors N13, N14 rises to 2.5V in standby mode. Here, since gate voltage of N-channel MOS transistors N13, N14 also rises to 1.2V, and also the precharge voltage of bit line BL rises to 1.2V, in respective N-channel MOS transistors N13, N14, the voltage difference between drain and gate as well as drain and source will be only 1.3V. Therefore, even though the gate insulating films of N-channel MOS transistors N13, N14 are formed thinner than the gate insulating films of a conventional driver transistor, the reliability of the gate insulating films of N-channel MOS transistors N13, N14 are maintained.

FIG. 35 shows an operating condition of the current drive circuit shown in FIG. 30 in select mode. Here, the case where a data of H level is written is shown. Specifically, referring to FIG. 35, in select mode, N-channel MOS transistors N13, N12 are on, and N-channel MOS transistors N11, N14 are off. Accordingly, data write current +Iw flows through bit line BL in the direction from N-channel MOS transistor N13 to N-channel MOS transistor N12.

FIG. 36 shows voltage distribution in the current drive circuit shown in FIG. 30 in select mode. Referring to FIG. 36, the voltage level received at AND gates G13, G14, G12, G22 and voltage V1, V2 is the same as in the standby mode. Gate potential Vg of N-channel MOS transistor N13 will be 3.0V in accordance with supply voltage level of AND gate G13. As described above, voltage VBL of bit line BL will be 1.0V–1.5V.

Accordingly, in select mode, even though voltage VBL of bit line BL rises from ground level, since voltage V1 rises to 2.5V, the voltage between drain and source of N-channel MOS transistor N13 is maintained in 1.5V–1.0V. Further, in accordance with the rising voltage V1 supply voltage of AND gate rises to 3.0V, which is higher than voltage V1. Therefore, N-channel MOS transistor N13 can be operated in saturation region, and the current drivability is maintained.

When writing a data of L level, N-channel MOS transistor N14 may be operated in a similar manner with N-channel MOS transistor N13.

In the foregoing, though N-channel MOS transistors N13, N14 supplying current to bit line BL have been described, their operating manner is also applicable to N-channel MOS transistors N11, N12 discharging bit line BL, as described in the second embodiment of the present invention.

As above, according to the MRAM device 100A according to the fourth embodiment, the effect similar to MRAM device 100 according to the second embodiment can be attained.

Fifth Embodiment

In a fifth embodiment, the current drive circuit as described according to the third embodiment, is applied to an OUM device. In the following, first, the structure of memory cells in the OUM device will be described.

Figure 37:
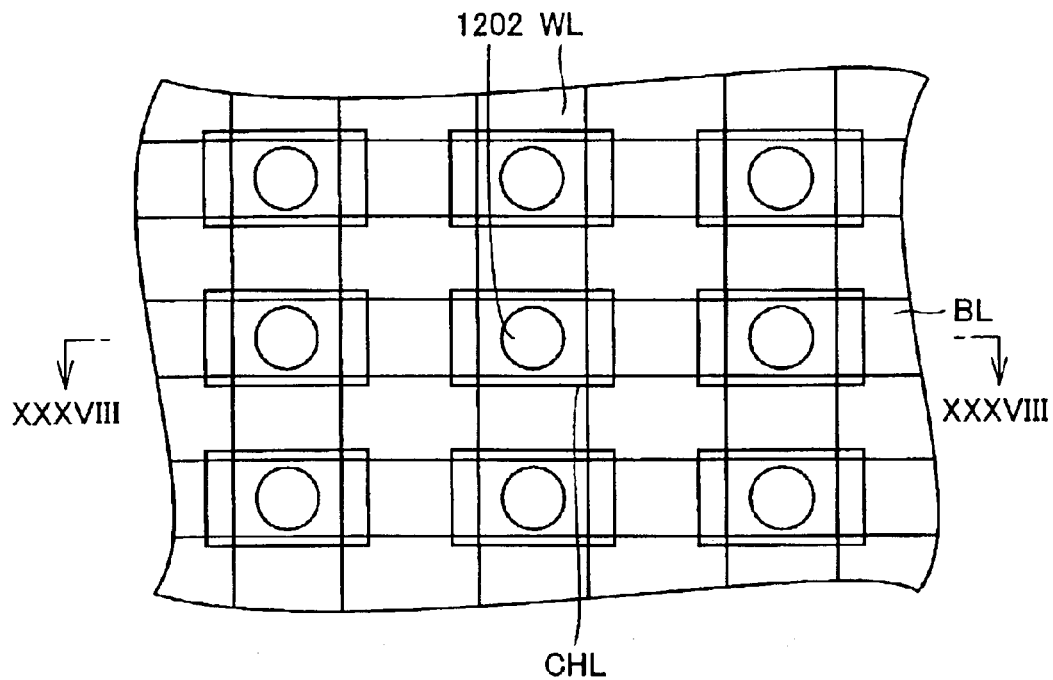
FIG. 37 is a plan view showing the configuration of a memory array of OUM.

FIG. 37 is a plan view showing the configuration of memory array of the OUM device. Referring to FIG. 37, memory cells (hereinafter refer to as "OUM cell") are arranged in rows and columns, and each word line WL and bit line BL are arranged corresponding to rows and columns of memory cells, respectively. In OUM cell, a chalcogenide layer CHL is heated by a heater 1202, and in responds to heating process, the phase change region of chalcogenide layer CHL becomes crystalline or amorphous.

Figure 38:
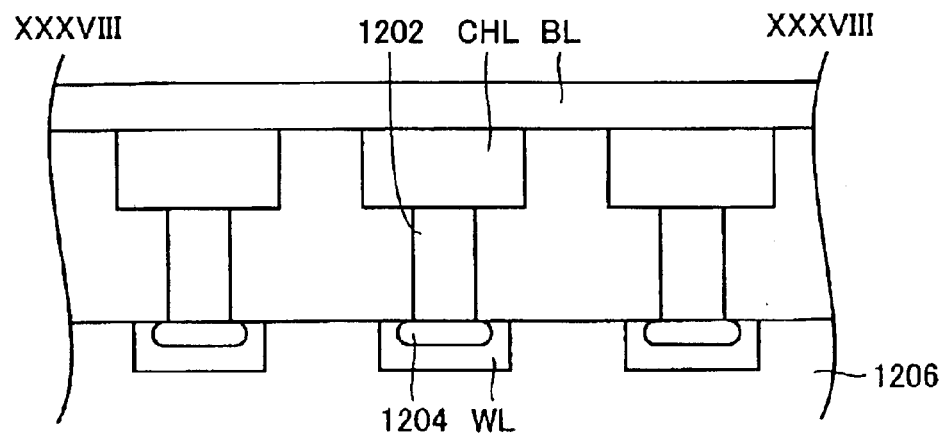
FIG. 38 is a cross sectional view showing cross section of the memory array of OUM device shown in FIG. 37.

FIG. 38 is a cross sectional view showing the cross section of the memory array of OUM device shown in FIG. 37. Referring to FIG. 38, chalcogenide layer CHL is sandwiched by bit line BL and heater 1202, and heater 1202 is connected to P-type layer 1204 formed in word line WL configured with N-type layer. Word line WL is formed inside P-type semiconductor substrate 1206, and thus, a PNP-type parasitic bipolar transistor is structured by P-type layer 1204, N-type layer word line WL and P-type semiconductor substrate 1206, In data writing, data write current Iw flows through bit line BL connected to OUM cell to be written a data (hereinafter OUM cell to be written/read data will also be referred to as "select OUM cell"), and word line WL connected to select OUM cell is deactivated. Then, in select OUM cell, PNP-type parasitic bipolar transistor is on, and cell current Icell flows from bit line BL via chalcogenide layer CHL and heater 1202 to PNP parasitic bipolar transistor formed below heater 1202. Heater 1202 is heated by this cell current Icell and heating resistor thereof, and the heat changes the phase of chalcogenide layer CHL.

Specifically, by the heat of heater 1202, chalcogenide layer CHL first turns to molten state, and when annealed, chalcogenide layer CHL becomes crystalline and when quenched it becomes amorphous. The control of annealing and quenching is done by selectively connecting a capacitor in a drive circuit driving the bit line. Specifically, when annealing, a capacitor is connected to reduce current gradually, and when quenching, the capacitor is disconnected to shut the current off quickly.

In chalcogenide layer CHL, the electric resistance changes depending on the phase state, and thus by relating electric resistance Rmax (corresponding to amorphous state) and Rmin (corresponding to crystalline state) of chalcogenide layer to stored data "1" and "0", respectively, data can be stored in non-volatile manner.

Figure 39:
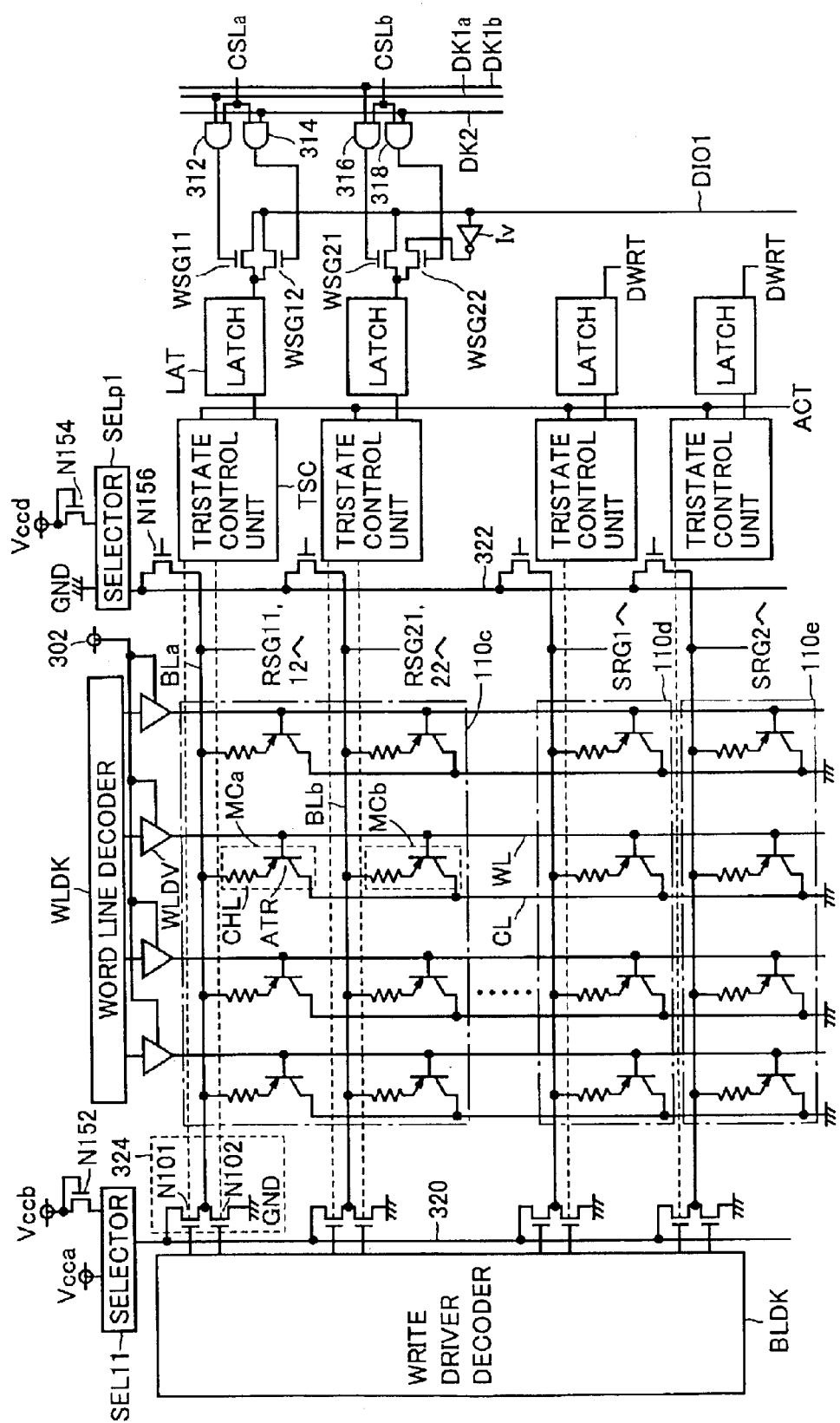
FIG. 39 is a first circuit diagram showing the prime configuration of OUM device according to a fifth embodiment.

FIG. 39 is a circuit diagram showing the prime configuration of the OUM device according to the fifth embodiment of the present invention. In FIG. 39, for the description, the prime configuration of the part related to a data writing operation is shown. The part related to data reading operation will be described later referring to FIG. 40.

Referring to FIG. 39, the OUM cells described above are arranged on memory array 110c, and each OUM cell includes chalcogenide layer CHL connected between corresponding bit line and a collector line CL, a heater (not shown) and access transistor ATR. Here, collector line CL is P-type semiconductor substrate 1206 as described above, and access transistor ATR is PNP parasitic bipolar transistor as described above.

Dummy OUM cells DMCa, DMCb having the same structure with the OUM cell in memory array 110c are arranged in memory array 110d, 110e, respectively, in the row direction. Dummy OUM cells DMCa, DMCb are in the phase state in which the chalcogenide layer shows resistance value of electric resistance Rmax and Rmin, respectively. Dummy OUM cells DMCa, DMCb are memory cells for generating the reference current to be compared to cell current Icell flowing through select OUM cell in data reading, when this OUM device is used in 1-cell mode, which will be described later.

OUM device 101 includes a write driver 324, a write driver decoder BLDK, a selector SEL11, power supply nodes Vcca, Vccb, an N-channel MOS transistor N152, a node 320, and a tristate control unit TSC. Write driver 324 includes N-channel MOS transistors N101, N102.

Write driver 324 and tristate control unit TSC are provided for each bit line, and together with power supply node Vcca, Vccb, N-channel MOS transistor N152, selector SEL11, node 320 and write driver decoder BLDK, structures a current drive circuit for passing current through corresponding bit line.

N-channel MOS transistors N101, N102 are configured with thinner gate insulating film as compare to that of the driver transistor of the conventional OUM device. N-channel MOS transistor N101 is connected between node 320 and bit line BL, and receives an output signal from write driver decoder BLDK at its gate. N-channel MOS transistor N102 is connected between bit line BL and ground node GND, and receives an output signal from write driver decoder BLDK at its gate.

Selector SEL11, power supply nodes Vcca, Vccb, and N-channel MOS transistor N152 structure a voltage supplying circuit. Selector SEL11 is connected between power supply node Vcca as well as N-channel MOS transistor N152 and node 320 connected to drain of N-channel MOS transistor N101.

Voltages of 2.5V and 1.5V are applied to power supply nodes Vcca, Vccb, respectively. Selector SEL11 receives voltage from power supply node Vcca and from power supply node Vccb via N-channel MOS transistor N152, and selects power supply node Vcca during active period, and select power supply node Vccb during inactive period, to supply voltage to node 320. N-channel MOS transistor N152 is provided to reduce the leakage current between drain and source of N-channel MOS transistor N101, and thus N-channel MOS transistor N152 is connected between power supply node Vccb and selector SEL11, and when power supply node Vccb is selected during inactive period by selector SEL11, reduces the voltage level of node 320 from 1.5V.

OUM device 101 further includes a selector SELp1, a power supply node Vccd, N-channel MOS transistors N154, N156, and a node 322. N-channel MOS transistor N156 is provided for each bit line, and together with selector SELp1, power supply node Vccd, ground node GND connected to selector SELp1 and node 322, configures a precharge circuit precharging corresponding bit line BL to a prescribed voltage.

N-channel MOS transistor N156 is connected to node 322 and corresponding bit line, and receives write bit line activation signal WACT (not shown) at its gate. Selector SELp1 is connected between N-channel MOS transistor N154, ground node GND, and node 322 connected to drain of N-channel MOS transistor N156.

High voltage is applied to power supply node Vccd, in a range not causing a current to flow through PN junction of access transistor ATR configured with PNP parasitic bipolar transistor. Selector SELp1 selects power supply node Vccd during active period, and select ground node GND during inactive period, to pass voltage to node 322, as will be described below.

OUM device 101 further includes a latch circuit LAT, write select gates WSG11–WSG22, AND gates 312–318, a data line DIO1, a word line decoder WLDK, a word line driver WLDV and a power supply node 302.

Next, data writing operation in OUM device 101 will be described. OUM device 101 is operative in two modes, namely 1-cell mode and 2-cell mode. In 1-cell mode, one memory cell is allocated for 1 bit data, whereas in 2-cell mode, two adjacent memory cells in column direction are allocated for 1 bit data, with one of the memory cells storing an inverted data of the other memory cell.

In the following, a writing operation in 2-cell mode will be described. A writing operation in 1-cell mode is the same as the writing operation to one of the memory cells in 2-cell mode.

In waiting mode where memory array is not activated, tristate control unit TSC is deactivated, and N-channel MOS transistors N101, N102 are both in an off state. Selector SELp1 selects ground node GND, and bit line BL is precharged to ground voltage level. Selector SEL11 selects power supply node Vccb. Here, since diode-connected N-channel MOS transistor N152 is provided between power supply node Vccb and selector SEL11, the voltage level of node 320 will be equal to the voltage of 1.5V applied to power supply node Vccb, subtracting threshold voltage of N-channel MOS transistor N152 therefrom. Therefore, the voltage difference between drain and gate and between drain and source in N-channel MOS transistor N101 is reduced, and thus the leakage current in N-channel MOS transistor N101 is reduced.

When the memory array is activated, selector SEL11 selects power supply node Vcca, and the voltage of node 320 rises to 2.5V. Selector SELp1 selects power supply node Vccd, and bit line BL is precharged in a range not causing a current to flow through PN junction of access transistor ATR configured with PNP parasitic bipolar transistor. Specifically, the voltage level of bit line BL rises in accordance with the rising voltage level of node 320.

Under this state, the tristate control unit TSC turns both of N-channel MOS transistors N101, 102 off. Here, write drive decoder BLDK raises the gate potential of N-channel MOS transistor N101 approximately to 1.2V. It should be noted that, the threshold voltage of N-channel MOS transistor N101 is designed at 1.2V or higher, and hence N-channel MOS transistor N101 does not turn on.

As above, the drain voltage of N-channel MOS transistor N101 rises to 2.5V, since gate voltage rises corresponding thereto and the bit line connected to the source is precharged to a prescribed voltage, excessive voltage will not be applied to the gate insulating film of N-channel MOS transistor N101, and thus the reliability of the gate insulating film is maintained.

The state where the memory array is activated and write driver 324 is turned off corresponds to "standby mode" according to the third embodiment.

After the memory array is activated, when writing data into OUM cell MCa and OUM cell MCb storing inverted data of the data stored in OUM cell MCa, enclosed by dot lines, respectively, a 2-cell decode signal DK2 and column select lines CSLa, CSLb are activated, and write select gates WSG12, WSG22 are on. Then, write data on data line DIO1 is taken and latched by latch circuit LAT corresponding to bit line BLa via write select gate WSG12, and the data inverted by inverter Iv also write data on data line DIO1 is taken and latched by latch circuit LAT corresponding to bit line BLb via write select gate WSG22.

Next, write driver 324 corresponding to select bit line BLa, BLb is driven simultaneously by tristate control unit TSC, and word line decoder WLDK deactivates word line driver WLDV.

For example, when writing to OUM cell MCa one data of L level ("0"), and writing to OUM cell MCb the other data of H level ("1") which is an inverted data of that one data, word line WL connected to OUM cell MCa, MCb is deactivated, and N-channel MOS transistors N101, N102 corresponding to bit lines BLa, BLb are on and off, respectively, and data write current Iw flows through bit lines BLa, BLb. Thus, the heaters (not shown) of OUM cells MCa, MCb are heated, and chalcogenide layers CHL of OUM cells MCa, MCb are molten.

Thereafter, the currents flowing from bit lines BLa, BLb to OUM cells MCa, MCb, respectively, are turned off. At that time, tristate control unit TSC corresponding to each bit line controls corresponding write drive 324 so that the current is gradually reduced at bit line BLa side, and the current is abruptly lowered at bit line BLb side, and accordingly, chalcogenide layer CHL at OUM cell MCa is annealed to be crystalline, while chalcogenide layer CHL at OUM cell MCb is quenched to be amorphous. In other words, data "0", "1" are written to OUM cell MCa, MCb, respectively.

In the foregoing, though the case where the drain voltage of N-channel MOS transistor N101 supplies current to bit line rises has been described, the operating manner thereof is also applicable to N-channel MOS transistor N102 discharging bit line. Specifically, in select mode, ground node GND connected to N-channel MOS transistor N102 may be applied with lower voltage as compared to ground voltage, to improve the current drivability of N-channel MOS transistor N102.

Figure 40:
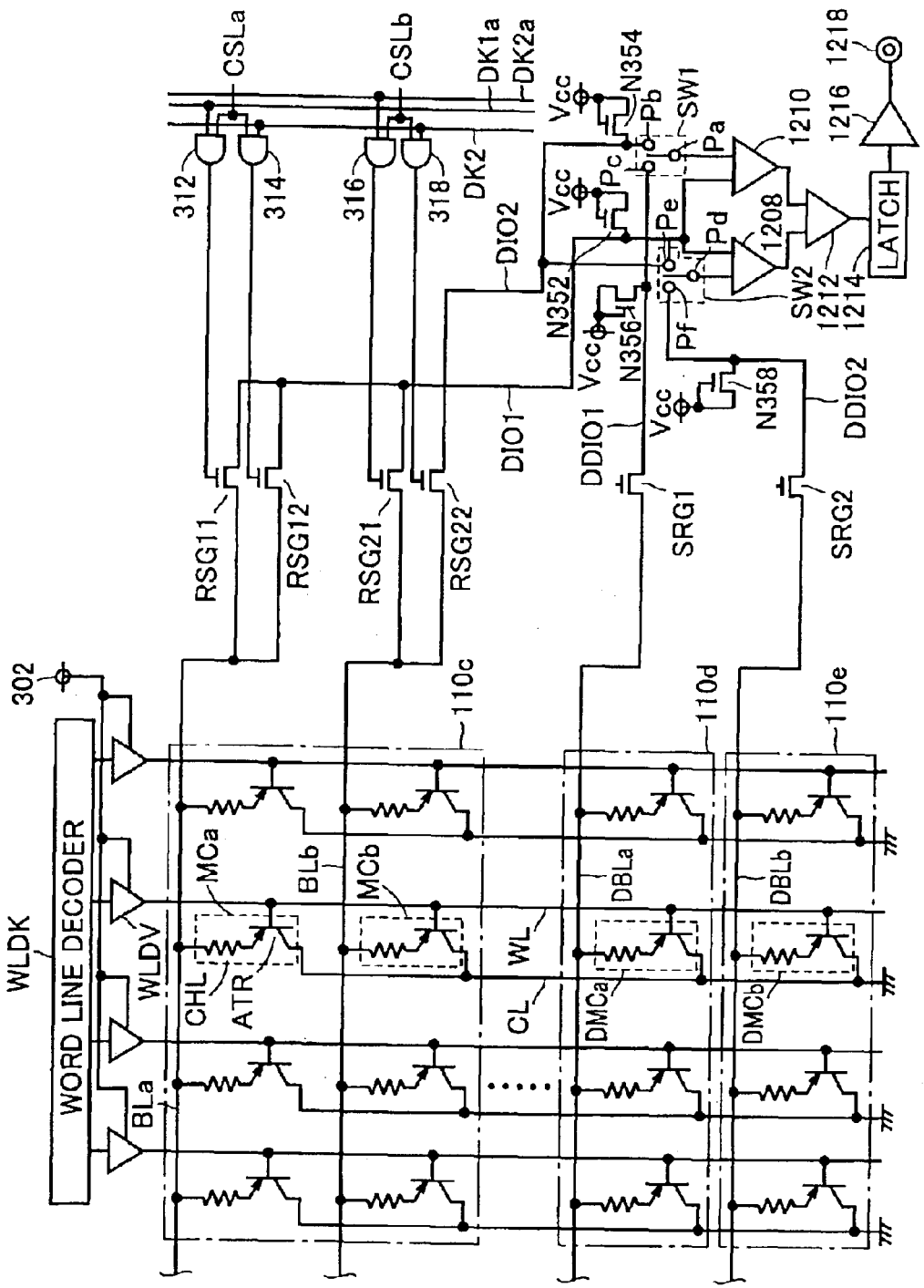
FIG. 40 is a second circuit diagram showing the prime configuration of OUM device according to the fifth embodiment.

FIG. 40 is a circuit diagram showing the prime configuration of OUM device according to the fifth embodiment of the present invention. As above, in FIG. 40, the prime structure of the part related to a data reading operation is shown.

Referring to FIG. 40, OUM device 101 includes read select gates RSG11–RSG22, dummy data read gates SRG1, SRG2, a data line DIO2, dummy data lines DDIO1, DDIO2, switches SW1, SW2, sense amplifiers 1208–1212, a latch circuit 1214, and output buffer 1216. Switches SW1, SW2 include contact points Pa–Pc and contact points Pd–Pf, respectively. The rest of the configuration illustrated has already described above referring to FIG. 39, and thus the description thereof will not be repeated.

In 1-cell mode, when reading data from OUM cell MCa enclosed by dot line, word line WL connecting to OUM cell MCa is deactivated by word line driver WLDV. Then, 1-cell decode signal DK1a and column select line CSLa are activated, and read select gate RSG11 is on to connect select bit line BLa to data line DIO1 via read select gate RSG11.

Further, in 1-cell mode, dummy data read gate SRG1, SRG2 are on to connect dummy bit lines DBLa, DBLb to dummy data lines DDIO1, DDIO2, respectively. Still further, at switch SW1, contact point Pa is connected to contact point Pc, and at switch SW2, contact point Pd is connected to contact point Pf.

Then, precharge current flows from data line DIO1 and dummy data lines DDIO1, DDIO2 to OUM cell MCa, dummy OUM cell DMCa, DMCb connected to select word line WL, respectively, and voltages in accordance with the resistance value of OUM cell MCa, dummy OUM cells DMCa, DMCb will be generated on data line DIO1 and dummy data lines DDIO1, DDIO2. Then, voltage differences between data line DIO1 and dummy data line DDIO1, and between data line DIO1 and dummy data line DDIO2 are detected by sense amplifiers 1208, 1210, respectively. Output signals from sense amplifiers 1208, 1210 are further compared by sense amplifier 1210 to determine the level of the stored data in OUM memory cell MCa.

In 2-cell mode, when reading data from OUM cell MCb which stores inverted data of the stored data in OUM cell MCa and OUM cell MCa, word line WL connected to OUM cells MCa, MCb is deactivated by word line driver WLDV.

Further, in 2-cell mode, 2-cell decode signal DK2 and read column select lines CSLa, CSLb are activated, then read select gates RSG12, RSG22 are on to connect select bit lines BLa, BLb to data lines DIO1, DIO2 via read select gates RSG12, RSG22, respectively. Further, at switch SW1, contact point Pa is connected to contact point Pb, and at switch SW2, contact point Pd is connected to contact point Pe.

Then, precharge current flows from data lines DIO1, DIO2 to OUM cells MCa, MCb connected to select word line WL, respectively, and voltages in accordance with the resistance value of OUM cells MCa, MCb will be generated on data lines DIO1, DIO2. Then, the voltage difference between data lines DIO1, DIO2 is detected by sense amplifiers 1208, 1210. Comparing output signals complementary to each other from sense amplifiers 1208–1218 by sense amplifier 1212, the level of the stored data is determined.

Figure 41:
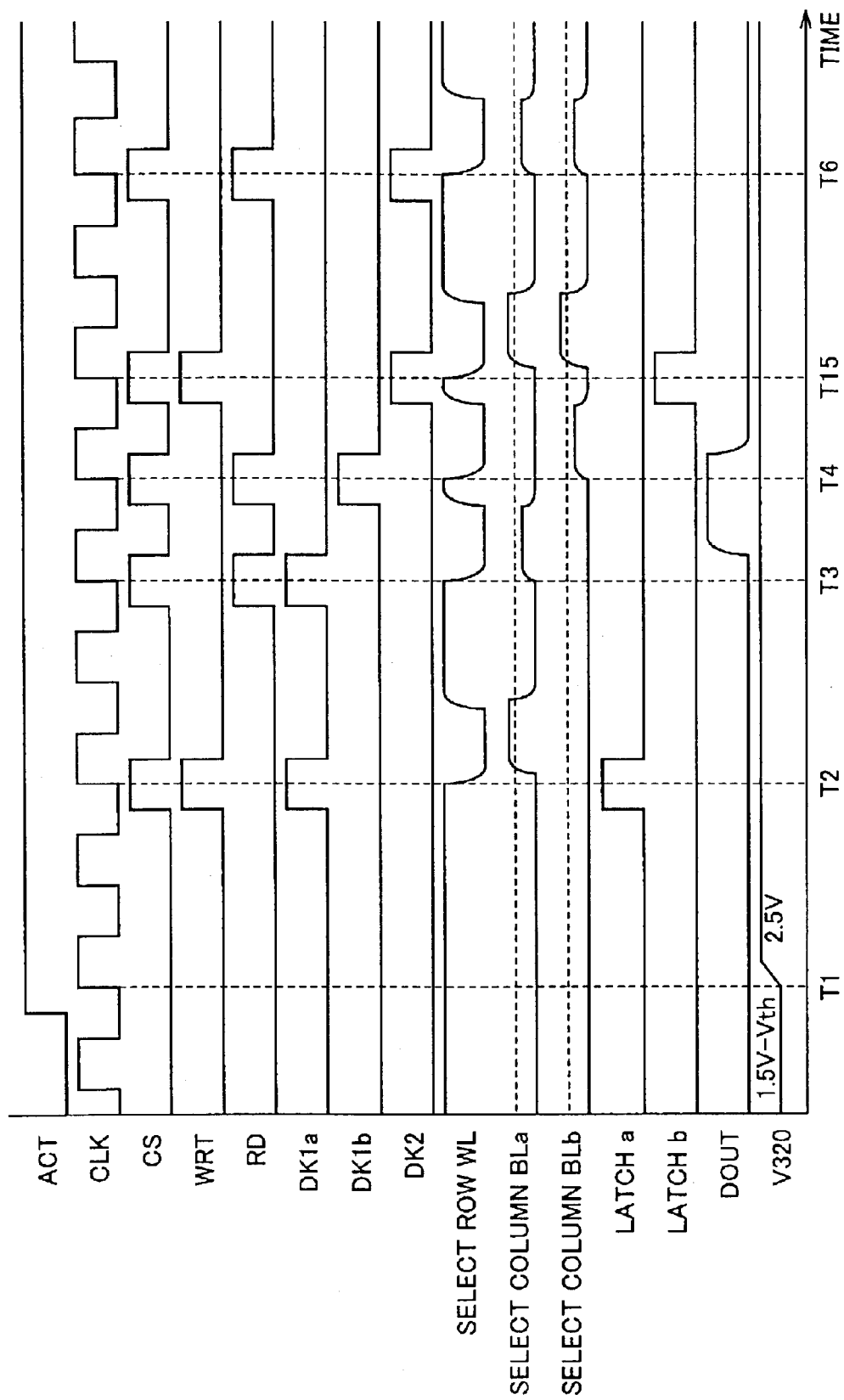
FIG. 41 is an operation waveform diagram related to a description of data reading/writing operations in OUM device according to the fifth embodiment.

FIG. 41 is an operation waveform diagram related to a description of reading/writing operations of data in OUM device 101. Referring to FIG. 41, OUM device 101 operates synchronizing to clock signal CLK. After power-on prior to time point T1, selector SEL11 selects power supply node Vccb, and voltage V320 of node 320 providing drain voltage of N-channel MOS transistor N101 will be 1.5V–Vth. Here, Vth is the threshold voltage of N-channel MOS transistor N152 shown in FIG. 39, and since Vth is approximately 0.3V, V320 will be approximately 1.2V.

At time point T1, when chip activating signal ACT goes H level, selector SEL11 selects power supply node Vcca and V320 rises to 2.5V.

At time point T2, data writing to OUM cell MCa in 1-cell mode is directed. When chip select signal CS and write command WRT are taken and 1-cell decode signal DK1a is activated in response to the direction of 1-cell mode operation, then simultaneously a write data is taken, and the write data is latched by latch circuit LAT corresponding to bit line BLa connected to OUM cell MCa (latch a). Then, select word line WL is deactivated, and data write current Iw flows through bit line BLa of select column, thus data of prescribed level is written to OUM cell MCa.

At time point T3, when chip select signal CS and read command RD are taken and 1-cell decode signal DK1a is activated, select word line WL is deactivated. Then, data read current Is is supplied to bit line BLa and dummy bit lines DBLa, DBLb (not shown). The voltages generated on bit line BLa and dummy bit lines DBLa, DBLb by data read current Is, are transmitted to data line pair DIO1 and dummy data lines DDIO1, DDIO2, respectively, and the voltage difference between data line pair DIO1 and dummy data lines DDIO1, DDIO2 is detected by sense amplifiers 1208–1210, and thus the data stored in OUM cell MCa is output as read data DOUT.

At time point T4, chip select signal CS and read command RD are taken, 1-cell decode signal DK1b is activated, and a data read operation from OUM cell MCb is directed.

At time point T5, data writing to OUM cells MCa, MCb in 2-cell mode is directed. When chip select signal CS and write command WRT are taken and 2-cell decode signal DK2 is activated, then simultaneously write data is taken, and write data is latched by latch circuit LAT corresponding to bit line BLa connected to OUM cell MCa (latch a), an inverted data of the write data is latched by latch circuit LAT corresponding to bit line BLb connected to OUM cell MCb (latch b). Then, select word line WL is deactivated, and write current Iw flows through bit lines BLa, BLb of select column, and thus the write data and the inverted data thereof is written to OUM cells MCa, MCb, respectively.

At time point T6, when chip select signal CS and read command RD are taken and 2-cell decode signal DK2 is activated, then select word line WL is deactivated and data read current Is is supplied to bit lines BLa, BLb. The voltages generated on bit lines BLa, BLb by data read current Is are transmitted to data lines DIO1, DIO2, respectively, and the voltage difference between data lines DIO1, DIO2 is detected by sense amplifiers 1208–1212, and thus the data stored in OUM cell MCa will be output as read data DOUT.

As above, according to OUM device 101 according to the fifth embodiment, even though the driver transistor of the current drive circuit is formed with thin gate insulating film, the reliability thereof is maintained, and additionally, the current drivability of the current drive circuit is maintained.

Further, according to OUM device 101, even though the driver transistor is formed with thin gate insulating film, the gate leakage current and leakage current between source and drain can greatly be reduced.

Sixth Embodiment

In MRAM device 100 according to the second embodiment, the current drive circuit is provided for each bit line at opposing sides thereof, thus a large number of the current drive circuits are required. In a sixth embodiment, an MRAM device with smaller number of current drive circuits is shown.

Figure 42:
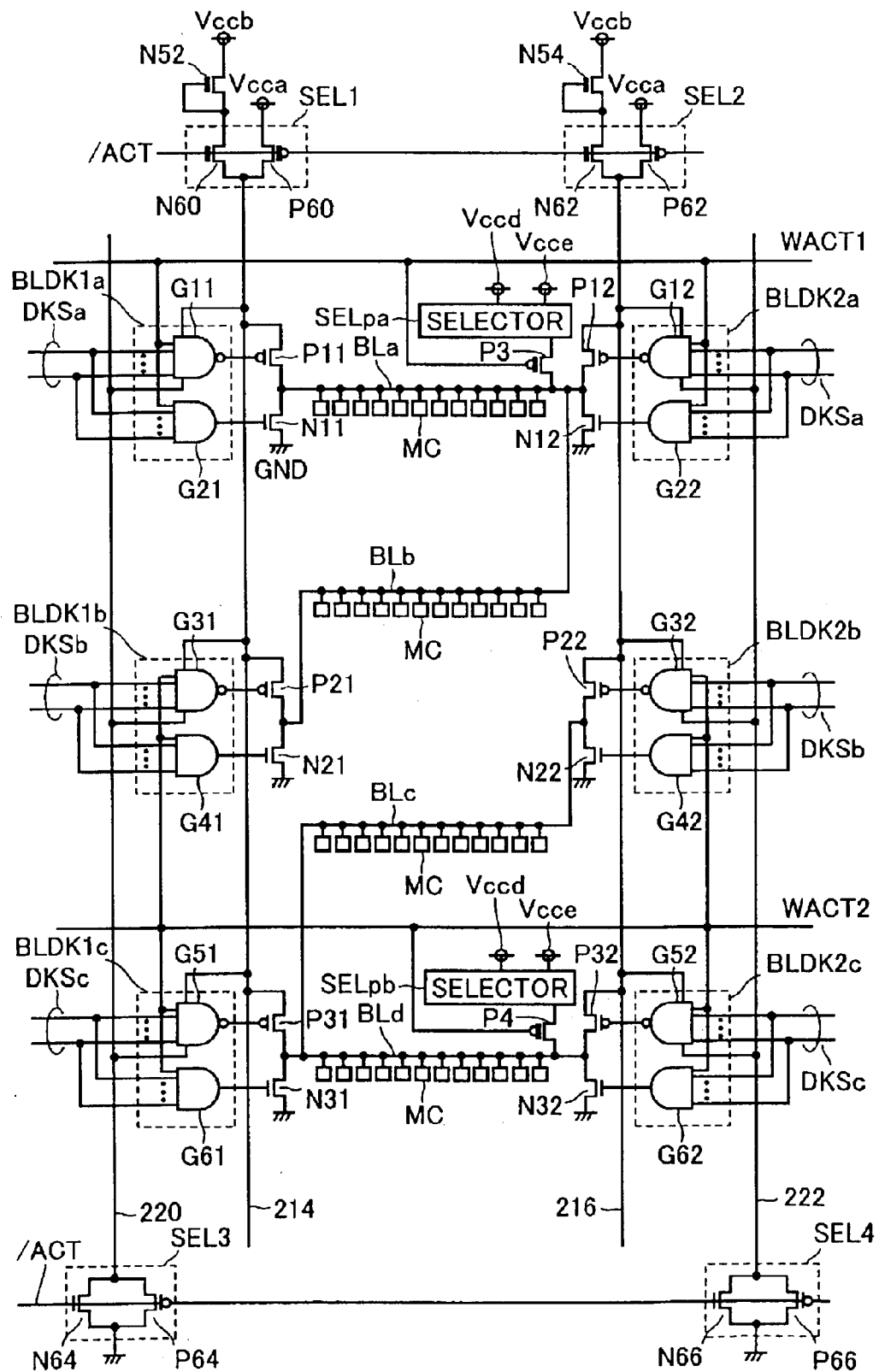
FIG. 42 is a circuit diagram showing the configuration of the part related to a current drive circuit of MRAM device according to a sixth embodiment.

FIG. 42 is a circuit diagram showing the configuration of the part related to a current drive circuit of MRAM device according to the sixth embodiment. In FIG. 42, a circuit diagram corresponding to FIG. 13 as described in the second embodiment is shown, and only the part related to four bit lines adjacent to each other among a plurality of bit lines is shown.

Referring to FIG. 42, bit line BLa has one end connected to bit line BLb, and the current drive circuit at the connecting side of bit lines BLa, BLb is shared by bit lines BLa, BLb. Bit line BLc is connected to bit line BLd at the opposite side to the side where bit lines BLa, BLb are connected, and the current drive circuit at the connecting side of bit lines BLc, BLd is shared by bit lines BLc, BLd. For each bit line, to the side not connected to adjacent bit line, a current drive circuit is provided corresponding to each bit line.

Each precharge circuit, precharging bit lines in waiting mode and standby mode, is provided for two adjacent bit lines having one end connected to each other. Specifically, one precharge circuit configured with P-channel MOS transistor P3, selector SELpa and power supply nodes Vccd, Vcce is provided for bit lines BLa, BLb, and one precharge circuit configured with P-channel MOS transistor P4, selector SELpb and power supply nodes Vccd, Vcce is provided for bit lines BLc, BLd. P-channel MOS transistors P3, P4 operate receiving write bit line activation signals WACT1, WACT2 at their gates, respectively.

The rest of the configuration is the same as that of MRAM device 100 according to the second embodiment shown in FIG. 13, therefore the description thereof will not be repeated.

By employing such configuration, in this example, the number of the current drive circuits and the precharge circuits are each reduced by two for every four bit lines, thus the area required for the device is reduced.

FIGS. 43 to 51 are the figures for describing herein the voltage distribution in the current drive circuit in MRAM device according to the sixth embodiment, in waiting mode, in standby mode and in select mode.

Figure 43:
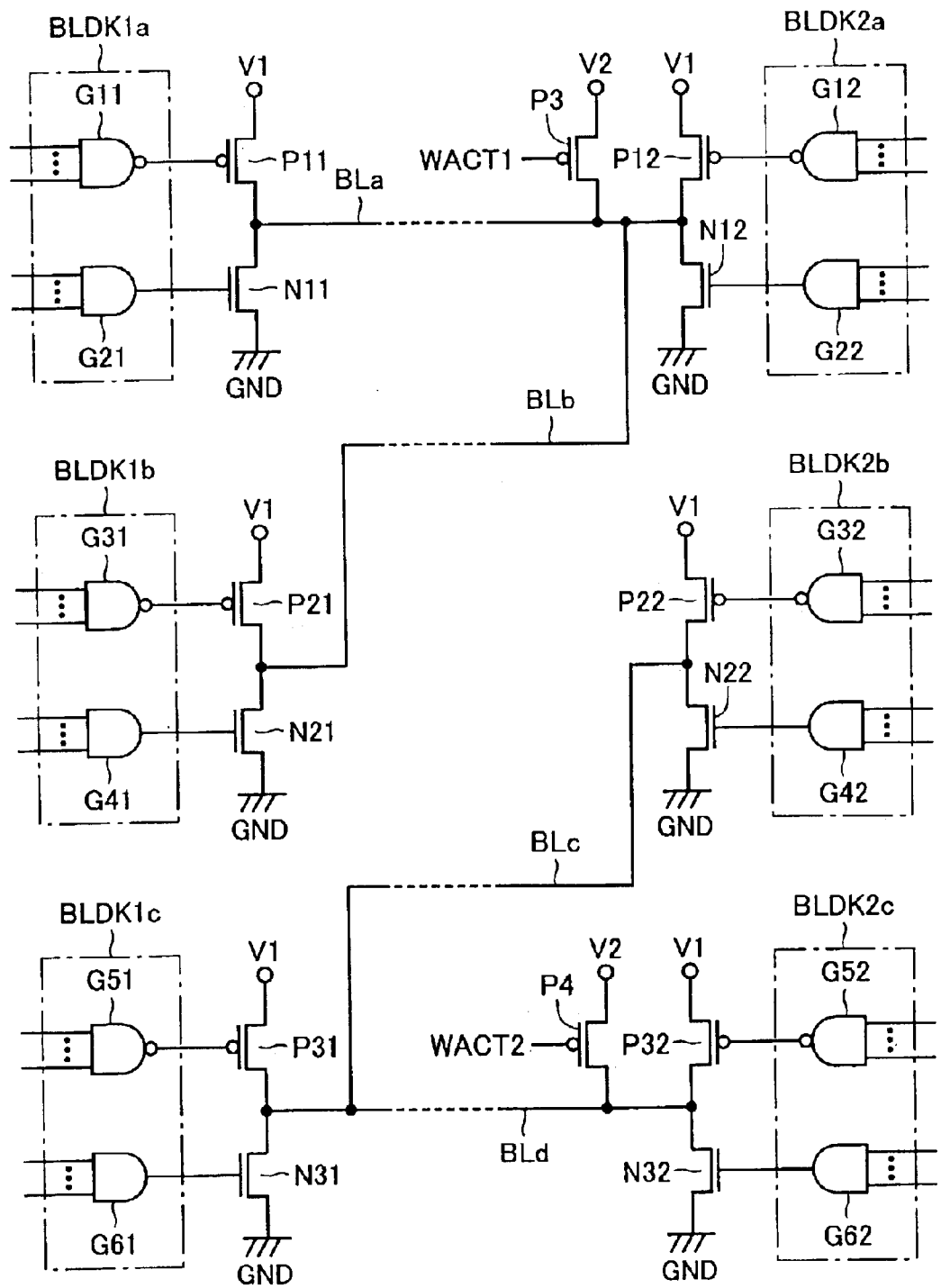
FIG. 43 is a circuit diagram schematically showing the prime configuration of the current drive circuit and MRAM device according to the sixth embodiment related to descriptions of voltage distribution of the current drive circuit.

FIG. 43 is a circuit diagram schematically showing the prime configuration of the current drive circuit in MRAM device according to the sixth embodiment, for describing herein the voltage distribution. Referring to FIG. 43, voltage V1 corresponds to the voltage of nodes 214, 216 shown in FIG. 42, and voltage V2 corresponds to output nodes of selectors SELpa, SELpb.

FIG. 44 shows an operating condition of the current drive circuit shown in FIG. 43 in waiting mode. Referring to FIG. 44, in waiting mode, P-channel MOS transistors P3, P4 are on, and bit lines BLa–BLd are precharged to a prescribed potential. Other P-channel MOS transistors P11–P32 and N-channel MOS transistors N11–N32 are all off.

FIG. 45 shows voltage distribution in the current drive circuit shown in FIG. 43 in waiting mode. Referring to FIG. 45, NAND gates G11–G52 and AND gates G21–G62 all operate receiving supply voltage of 1.2V and ground voltage of 0V. Thus, gate potential Vg of P-channel MOS transistors P11–P32 will be 1.2V, and gate potential Vg of N-channel MOS transistors N11–N32 will be 0V. Voltages V1, V2 will be 1.2V, 0.6V, respectively, and the voltage of bit lines BLa–BLd will be all 0.6V.

Accordingly, as described in the second embodiment, in the MRAM device according to the sixth embodiment also, the voltage difference between source and drain in each driver transistor is suppressed smaller, and thus, even though each transistor is configured with a transistor having thin gate insulating film which have large leakage current as compared to the transistor having a thick gate insulating film, a leakage current in each transistor is greatly suppressed.

FIG. 46 shows an operating condition of the current drive circuit shown in FIG. 43 in standby mode. The operating condition of the current drive circuit in standby mode is the same as in waiting mode shown in FIG. 44.

FIG. 47 shows voltage distribution and the current drive circuit shown in FIG. 43 in standby mode. Referring to FIG. 47, in standby mode, NAND gates G11–G52 operate receiving supply voltage of 2.5V and ground voltage of 1.2V. Accordingly, gate potential Vg of P-channel MOS transistors P11–P32 will be 2.5V. Voltages V1, V2 will be 2.5V, 1.2V, respectively, and the voltage of bit lines BLa–BLd will be all 1.2V.

Accordingly, as described in the second embodiment, in the MRAM device according to the sixth embodiment also, the voltage difference between source and drain in each driver transistor will be only 1.3V in standby mode, and thus even though each transistor is formed with a transistor having thin gate insulating film having large leakage current as compared to a transistor having a thick gate insulating film, a leakage current in each transistor is greatly suppressed.

FIG. 48 shows a first operating condition of the current drive circuit shown in FIG. 43 in select mode. Here, MTJ memory cell MC on bit line BLa is selected, and data of H level is written to MTJ memory cell MC.

Referring to FIG. 48, in the first operating condition, P-channel MOS transistor P11 and N-channel MOS transistors N12, N21 are on, and other transistors structuring write driver are off. P-channel MOS transistors P3, P4 are off and on, respectively. Accordingly, the current supplied by P-channel MOS transistor P11 is discharged from N-channel MOS transistors N12, N21, and data write current +Iw flows through bit line BLa (in the direction from left to right in FIG. 43). Though current also flows through bit line BLb, since its magnitude is half of the data write current Iw, data writing to a memory cell connected to bit line BLb will not be executed.

FIG. 49 shows voltage distribution in the current drive circuit shown in FIG. 43 in the first operating condition. Referring to FIG. 49, the voltage level receive at NAND gates G11–G52 and AND gates G21–G62 and the voltages V1, V2 are the same as in the standby mode. Gate potential Vg of P-channel MOS transistor P11 will be 1.2V in accordance with ground voltage level of NAND gate G11. Since two discharging N-channel MOS transistors are on, the voltage of bit line BLa will be lower than when only one N-channel MOS transistor is on, and the value will be 0.7–1.2V.

As above, in the first operating condition, since voltage V1 rises to 2.5V and additionally two discharging N-channel MOS transistors are on, the voltage of bit line BLa will be lower than when only one discharging N-channel MOS transistor is on. Therefore, the current drivability of P-channel MOS transistor P11 will further be increased, or, the same current drivability is maintained while the size of P-channel MOS transistor P11 is made smaller.

FIG. 50 shows a second operating condition of the current drive circuit shown in FIG. 43 in select mode. Here, MTJ memory cell MC on bit line BLb is selected, and a data of L level is written to MTJ memory cell MC.

Referring to FIG. 50, in the second operating condition, P-channel MOS transistors P11, P12 and N-channel MOS transistor N21 are on, and other transistor structuring write driver are off. P-channel MOS transistors P3, P4 are off and on, respectively. Therefore, the current supplied from P-channel MOS transistors P11, P12 will be discharged by N-channel MOS transistor N21, and data write current −Iw flows through bit line BLb (in a direction from right to left in the FIG. 43). Though a current also flows through bit line BLa, the magnitude thereof will be only the half of data write current Iw, and thus data writing to the memory cell connected to bit line BLa is not executed.

FIG. 51 shows voltage distribution in the current drive circuit shown in FIG. 43 in the second operating condition. Referring to FIG. 51, the voltage level received at NAND gates G11–G52 and AND gates G21–G62, and voltages V1, V2 at the second operating condition are the same as in the standby mode. Gate potential Vg of P-channel MOS transistors P11, P12 will be 1.2V in accordance with ground voltage level of NAND gates G11, G12, respectively. The voltage of bit line BLb will be 1.0–1.5V.

As above, since the source-drain voltage of P-channel MOS transistor P11 is maintained in 1.0V–1.5V in the second operating condition, P-channel MOS transistor P11 can be operated in the saturation region, and thus the current drivability is maintained.

In either of the first and second operating conditions, when P-channel MOS transistor P11 and/or P12 are/is on, as voltage V1 rises to 2.5V, gate potential Vg will rise to 1.2V in accordance with ground voltage of NAND gates G11, G12, then the voltage difference between source and gate of P-channel MOS transistor P11, P12 will be only 1.3V, and therefore, even though P-channel MOS transistors P11, P12 are configured with thin gate insulating films, the reliability as gate insulating films of P-channel MOS transistors P11, P12 is maintained.

When writing a data of L level to the memory cell on bit line BLa, specifically, when data write current −Iw flows through bit line BLa, or when writing a data of H level to the memory cell on bit line BLb, specifically, when data write current +Iw flows through bit line BLb, similar control will be conducted. Specifically, having the memory cell to be written the data as a starting point, in the current drive circuit at the upstream of the current, the transistors connected to power supply node are all on, and in current drive circuit at the downstream of the current, the transistors connected to ground node are all on.

In the foregoing, though P-channel MOS transistors P11, P12 supplying current to bit line BL have been described, the same manner is also applicable, as described in the second embodiment, to N-channel MOS transistors N11, N12 discharging bit line BL.

In order to reduce the number of current drive circuits further, adjacent four bit lines can be connected together.

Figure 52:
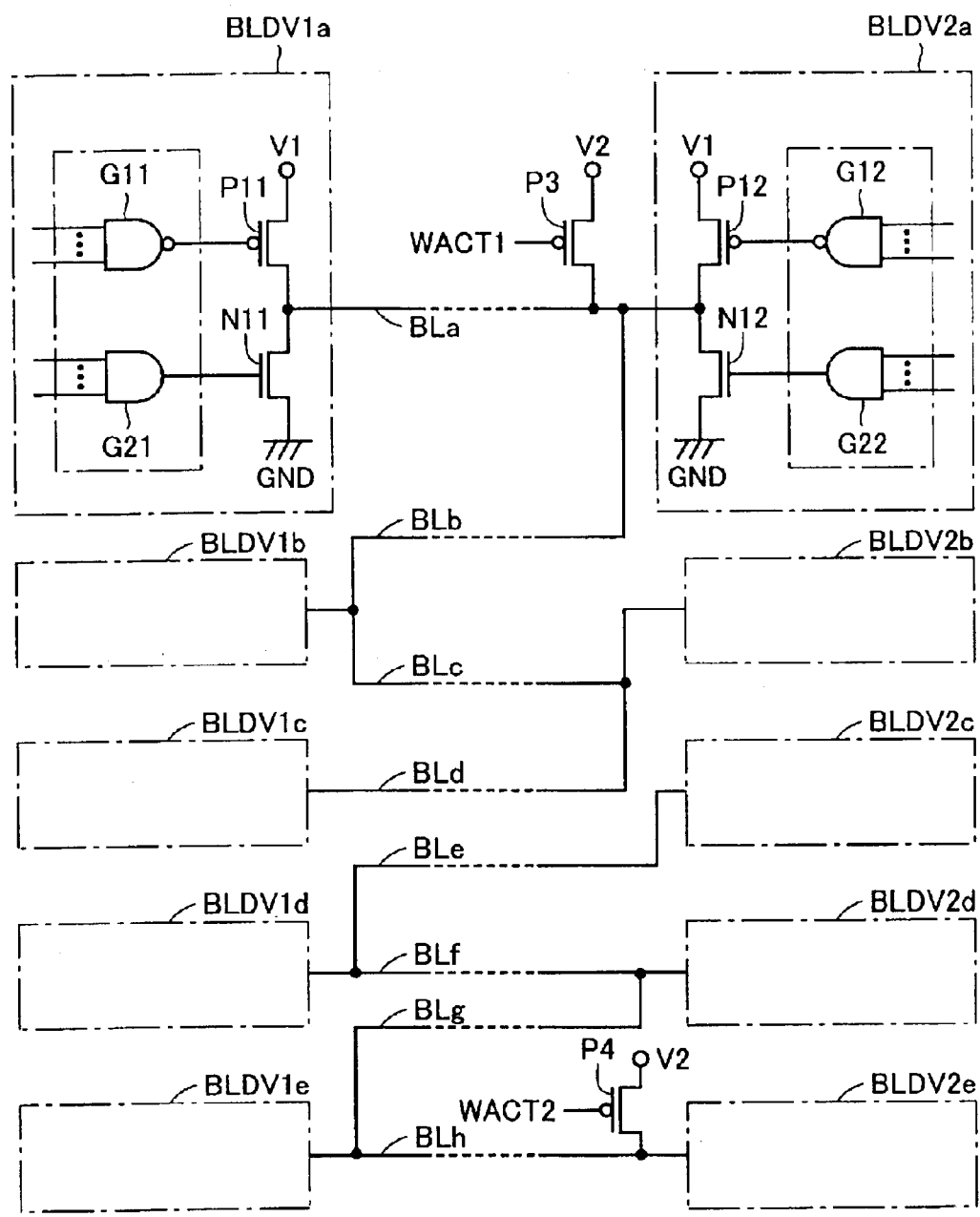
FIG. 52 is a circuit diagram showing the configuration of the part related to a current drive circuit in which adjacent four bit lines are connected.

FIG. 52 is a circuit diagram showing the configuration of the part related to the current drive circuit when adjacent four bit lines are connected together. In FIG. 52, only the part related to adjacent eight bit lines among a plurality of bit lines are shown.

Referring to FIG. 52, bit line BLb has one end connected to bit line BLa, and current drive unit BLDV2a at the connecting side of bit lines BLa, BLb is shared by bit lines BLa, BLb. Additionally, bit line BLb has the other end connected to bit line BLc, and current drive unit BLDV1b at the connecting side of bit lines BLb, BLc is shared by bit lines BLb, BLc. Bit line BLc is connected to bit line BLd at the opposite side to the side connecting to bit line BLb, and current drive unit BLDV2b at the connecting side of bit lines BLc, BLd is shared by bit lines BLc, BLd. For each bit line, to the side not connected to adjacent bit line, a current drive circuit is provided corresponding to each bit line.

Each precharge circuit, precharging bit line in waiting mode and standby mode, is provided for every adjacent four bit lines. Specifically, one precharge circuit configured with P-channel MOS transistor P3 is provided for four bit lines BLa–BLd, and one precharge circuit configured with P-channel MOS transistor P4 is provided for bit lines BLe–BLh.

The rest of the configuration is the same as that of MRAM device 100 according to the second embodiment shown in FIG. 13, therefore the description thereof will not be repeated.

By applying such configuration, the total number of current drive circuits for 4 bit lines will be five, which is reduced as compared to the six circuits in MRAM device as shown in FIG. 43. Further, since only one precharge circuit is required for 4 bit lines, the area required for the device can be reduced.

Though it will not be illustrated, it should be noted that increasing the number of connected bit lines, the number of the current drive circuits and the precharge circuits is reduced.

In the above description, though the transistors at the power supply side of the write drive are configured with P-channel MOS transistors P11, P12, P-channel MOS transistors P11, P12 may be replaced by N-channel MOS transistors as described in the third embodiment which corresponds to the first embodiment.

As above, according to the MRAM device according to the sixth embodiment, adjacent bit lines are connected at one end to share the current drive circuit and the precharge circuit, the number thereof is reduced to attain smaller device area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A current drive circuit passing a current through a load circuit with resistance, comprising:
    a node connected to said load circuit; and
    a driver receiving a first voltage and a second voltage; wherein
    a voltage difference between said second voltage and a voltage on said node is larger than a voltage difference between said first voltage and the voltage on said node; and
    said driver passes a current through said node in accordance with said voltage difference between said second voltage and the voltage on said node.

2. The current drive circuit according to claim 1, further comprising
    a precharge circuit precharging said node to a third voltage when a current does not pass through said node.

3. The current drive circuit according to claim 1, wherein
    said driver includes a transistor receiving either one of said first or second voltage at one terminal, with other terminal connected to said node.

4. The current drive circuit according to claim 3, wherein
    said driver further includes a voltage supplying circuit; and wherein
    said voltage supplying circuit receives said first and second voltages, and supplies said first voltage to said transistor when the current drive circuit is deactivated, and supplies said second voltage to said transistor when the current drive circuit is activated.

5. The current drive circuit according to claim 3, further comprising a control circuit controlling an operation of the current drive circuit in accordance with an operating mode, wherein
    said operating mode is any one of
    an inactive mode in which said first voltage is applied to said one terminal of said transistor
    a standby mode in which said transistor is in an off state when said second voltage is applied to said one terminal of said transistor; and
    an active mode in which said transistor is in an on state when said second voltage is applied to said one terminal of said transistor; wherein
    said control circuit controls
    an operation of said transistor based on a first operating voltage when said operating mode is said inactive mode; and
    an operation of said transistor based on a second operating voltage when said operating mode is either said standby mode or said active mode; and wherein
    a voltage difference between said second operating voltage and said second voltage is smaller than a voltage difference between said second voltage and said first operating voltage.

6. The current drive circuit according to claim 5, wherein
    said first operating voltage is made of a first supply voltage and a first ground voltage,
    said second operating voltage is made of a second supply voltage and a second ground voltage,
    a voltage difference between said second voltage and said second supply voltage is smaller than a voltage difference between said second voltage and said first supply voltage,
    a voltage difference between said second voltage and said second ground voltage is smaller than a voltage difference between said second voltage and said first ground voltage, and said control circuit, when said operating mode is said inactive mode, outputs a first gate voltage turning said transistor on and a second gate voltage turning said transistor off based on said first supply voltage and said first ground voltage, and when said operating mode is either said standby mode or said active mode, outputs said first and second gate voltages based on said second supply voltage and said second ground voltage.

7. The current drive circuit according to claim 6, wherein said driver further includes another transistor, said transistor is connected between a power supply node and said node for supplying electrical charges to said node, said another transistor is connected between said node and a ground node for discharging electrical charges from said node;

said transistor is configured with an N-channel MOS transistor, and said second supply voltage is set higher than said second voltage.

8. A semiconductor memory device, comprising:

a plurality of memory cells arranged in rows and columns;

a plurality of bit lines provided corresponding to each column of memory cells; and a plurality of current drive circuits provided corresponding to said plurality of bit lines, passing a current through corresponding bit line; wherein each of said plurality of current drive circuits receives a first voltage and a second voltage, a voltage difference between said second voltage and a voltage on said corresponding bit line is larger than a voltage difference between said first voltage and the voltage on said corresponding bit line, and each of said plurality of current drive circuits passes a current through said corresponding bit line in accordance with said voltage difference between said second voltage and the voltage on said corresponding bit line.

9. The semiconductor memory device according to claim 8, further comprising a voltage supply circuit receiving said first and second voltages, and when the semiconductor memory device is deactivated, supplying said first voltage to said plurality of current drive circuits, and when the semiconductor memory device is activated, supplying said second voltage to said plurality of current drive circuits.

10. The semiconductor memory device according to claim 8, further comprising a plurality of precharge circuits provided corresponding to said plurality of bit lines, and when a current does not pass through corresponding bit line, precharging said corresponding bit line to a third voltage.

11. The semiconductor memory device according to claim 10, wherein each of said plurality of current drive circuits includes a first transistor connected between said corresponding bit line and a power supply node, and supplying electrical charges to said corresponding bit line, and a second transistor connected between said corresponding bit line and a ground node, and discharging electrical charges of said corresponding bit line.

12. The semiconductor memory device according to claim 11, wherein said third voltage is at a same voltage level with a gate voltage and said first voltage applied to a gate of said first transistor and said power supply node, respectively, in the current drive circuit when the current drive circuit is deactivated.

13. The semiconductor memory device according to claim 11, wherein each of said plurality of current drive circuits further includes a control circuit controlling an operation of said first and second transistors, and said control circuit, when the current drive circuit is activated, controls an operation of said first transistor based on an operating voltage higher than when the current drive circuit is deactivated.

14. The semiconductor memory device according to claim 11, wherein said second transistor, when the current drive circuit is activated, receives a fourth voltage lower than a ground voltage from said ground node.

15. The semiconductor memory device according to claim 8, wherein each of said plurality of bit lines has its opposing ends connected to one of said current drive circuits, respectively, two adjacent bit lines among said plurality of bit lines have their one ends connected to each other, and share one of said current drive circuits connected to said connected one ends.

16. The semiconductor memory device according to claim 8, wherein each of said plurality of memory cells includes a resistor element, of which resistance value is determined in accordance with stored data, and which stores a data in accordance with said resistance value.

* * * * *